United States Patent
Reeves et al.

(10) Patent No.: US 9,474,021 B2
(45) Date of Patent: Oct. 18, 2016

(54) DISPLAY CLIPPING ON A MULTISCREEN DEVICE

(71) Applicant: Z124, George Town (KY)

(72) Inventors: Paul E. Reeves, Oakville (CA); John S. Visosky, Gormley (CA); Roomi Sahi, Stoney Creek (CA)

(73) Assignee: Z124, George Town (KY)

( * ) Notice: Subject to any disclaimer, the term of this patent is extended or adjusted under 35 U.S.C. 154(b) by 0 days.

(21) Appl. No.: 14/858,967

(22) Filed: Sep. 18, 2015

(65) Prior Publication Data

US 2016/0078591 A1 Mar. 17, 2016

Related U.S. Application Data

(63) Continuation of application No. 13/629,211, filed on Sep. 27, 2012, now abandoned.

(60) Provisional application No. 61/539,884, filed on Sep. 27, 2011.

(51) Int. Cl.
*G09G 5/00* (2006.01)
*H04W 48/18* (2009.01)
(Continued)

(52) U.S. Cl.
CPC ........ *H04W 48/18* (2013.01); *B29D 11/00673* (2013.01); *E05D 3/12* (2013.01); *G02B 6/0001* (2013.01); *G06F 1/1601* (2013.01); *G06F 1/1605* (2013.01); *G06F 1/1616* (2013.01); *G06F 1/1618* (2013.01); *G06F 1/1637* (2013.01); *G06F 1/1641* (2013.01); *G06F 1/1643* (2013.01); *G06F 1/1647* (2013.01); *G06F 1/1649* (2013.01); *G06F 1/1677* (2013.01); *G06F 1/1681* (2013.01); *G06F 1/1692* (2013.01); *G06F 3/00* (2013.01);
(Continued)

(58) Field of Classification Search
CPC .... G06F 3/048; G06F 3/0484; G06F 3/1454; G06F 9/4445
USPC .......................................... 345/1.3, 156, 650
See application file for complete search history.

(56) References Cited

U.S. PATENT DOCUMENTS 5,157,763 A 10/1992 Peters et al.
5,467,102 A * 11/1995 Kuno ................... G06F 1/1618
345/1.3

(Continued)

FOREIGN PATENT DOCUMENTS

CN 101470469 7/2009
CN 101686280 3/2010
(Continued)

OTHER PUBLICATIONS

U.S. Appl. No. 14/885,116, filed Oct. 16, 2015, Sirpal et al.
(Continued)

*Primary Examiner* — Calvin C Ma
(74) *Attorney, Agent, or Firm* — Sheridan Ross P.C.

(57) ABSTRACT

Embodiments are described for handling situations when a window or application is repositioned and clipped in a multi-screen device. In embodiments, if the window is repositioned such that it cannot be displayed entirely on one display, but would otherwise spillover or spill onto another display, the window or application is clipped. Such clipping is performed based on the size and location of the window and the size and location of the display.

20 Claims, 32 Drawing Sheets

(51) Int. Cl.

| | | |
|---|---|---|
| G06F 1/16 | (2006.01) | |
| G06F 3/0488 | (2013.01) | |
| G06F 9/44 | (2006.01) | |
| G06F 3/0481 | (2013.01) | |
| G06F 3/0483 | (2013.01) | |
| G06F 3/14 | (2006.01) | |
| G09G 5/14 | (2006.01) | |
| B29D 11/00 | (2006.01) | |
| E05D 3/12 | (2006.01) | |
| F21V 8/00 | (2006.01) | |
| G06F 3/01 | (2006.01) | |
| G06F 3/041 | (2006.01) | |
| G06F 3/048 | (2013.01) | |
| G06F 3/0489 | (2013.01) | |
| G06T 3/00 | (2006.01) | |
| G09G 1/00 | (2006.01) | |
| G09G 5/34 | (2006.01) | |
| H04M 1/02 | (2006.01) | |
| H04N 5/445 | (2011.01) | |
| H04W 72/06 | (2009.01) | |
| H04W 88/06 | (2009.01) | |
| H05K 5/00 | (2006.01) | |
| H05K 5/02 | (2006.01) | |
| H05K 5/04 | (2006.01) | |
| H05K 7/02 | (2006.01) | |
| H05K 7/14 | (2006.01) | |
| H05K 13/00 | (2006.01) | |
| H05K 13/04 | (2006.01) | |
| G06F 3/00 | (2006.01) | |
| G06F 3/0484 | (2013.01) | |
| H04W 88/02 | (2009.01) | |
| G06F 3/0482 | (2013.01) | |
| G09G 5/12 | (2006.01) | |
| G06F 3/0346 | (2013.01) | |
| H04N 5/232 | (2006.01) | |
| H04N 5/262 | (2006.01) | |
| G06F 3/0486 | (2013.01) | |
| G06F 3/0485 | (2013.01) | |
| G06F 17/30 | (2006.01) | |
| G06F 9/00 | (2006.01) | |
| G06F 3/16 | (2006.01) | |

(52) U.S. Cl.
CPC ............ *G06F 3/01* (2013.01); *G06F 3/017* (2013.01); *G06F 3/0346* (2013.01); *G06F 3/041* (2013.01); *G06F 3/048* (2013.01); *G06F 3/0412* (2013.01); *G06F 3/0416* (2013.01); *G06F 3/0481* (2013.01); *G06F 3/0482* (2013.01); *G06F 3/0483* (2013.01); *G06F 3/0484* (2013.01); *G06F 3/0485* (2013.01); *G06F 3/0486* (2013.01); *G06F 3/0488* (2013.01); *G06F 3/04817* (2013.01); *G06F 3/04842* (2013.01); *G06F 3/04845* (2013.01); *G06F 3/04883* (2013.01); *G06F 3/04886* (2013.01); *G06F 3/04897* (2013.01); *G06F 3/1423* (2013.01); *G06F 3/1438* (2013.01); *G06F 3/1446* (2013.01); *G06F 3/167* (2013.01); *G06F 9/00* (2013.01); *G06F 9/44* (2013.01); *G06F 9/4443* (2013.01); *G06F 17/3028* (2013.01); *G06F 17/30274* (2013.01); *G06T 3/00* (2013.01); *G09G 1/00* (2013.01); *G09G 5/00* (2013.01); *G09G 5/12* (2013.01); *G09G 5/14* (2013.01); *G09G 5/34* (2013.01); *H04M 1/0216* (2013.01); *H04M 1/0266* (2013.01); *H04N 5/23293* (2013.01); *H04N 5/2628* (2013.01); *H04N 5/44591* (2013.01); *H04W 72/06* (2013.01); *H04W 88/02* (2013.01); *H04W 88/06* (2013.01); *H05K 5/0017* (2013.01); *H05K 5/0226* (2013.01); *H05K 5/04* (2013.01); *H05K 7/02* (2013.01); *H05K 7/1452* (2013.01); *H05K 13/00* (2013.01); *H05K 13/046* (2013.01); *E05Y 2900/606* (2013.01); *G06F 1/16* (2013.01); *G06F 2203/04803* (2013.01); *G09G 2300/023* (2013.01); *G09G 2330/021* (2013.01); *G09G 2354/00* (2013.01); *Y10T 16/547* (2015.01); *Y10T 29/4984* (2015.01); *Y10T 29/49826* (2015.01)

(56) References Cited

U.S. PATENT DOCUMENTS

| | | |
|---|---|---|
| 5,564,002 A | 10/1996 | Brown |
| 5,874,960 A | 2/1999 | Mairs et al. |
| 5,889,517 A | 3/1999 | Ueda et al. |
| 7,137,074 B1 | 11/2006 | Newton et al. |
| 7,636,899 B2 | 12/2009 | Purcell et al. |
| 7,681,143 B2 | 3/2010 | Lindsay et al. |
| 7,739,604 B1 | 6/2010 | Lyons et al. |
| 8,108,782 B2 | 1/2012 | Rajpal et al. |
| 8,290,540 B2 | 10/2012 | Kittel et al. |
| 8,300,022 B2 | 10/2012 | Brenneman et al. |
| 8,385,057 B2 | 2/2013 | Liu et al. |
| 8,423,911 B2 | 4/2013 | Chaudhri |
| 8,665,215 B2 | 3/2014 | Schrock et al. |
| 9,001,149 B2 | 4/2015 | Sirpal et al. |
| 9,141,135 B2 | 9/2015 | Sirpal et al. |
| 9,152,176 B2 | 10/2015 | Gimpl et al. |
| 9,158,494 B2 | 10/2015 | Sirpal et al. |
| 9,223,426 B2 | 12/2015 | Sirpal et al. |
| 2002/0021278 A1 | 2/2002 | Hinckley et al. |
| 2002/0089505 A1 | 7/2002 | Ording |
| 2002/0140698 A1 | 10/2002 | Robertson et al. |
| 2002/0140746 A1 | 10/2002 | Gargi |
| 2004/0066408 A1 | 4/2004 | Meyers et al. |
| 2004/0095401 A1 | 5/2004 | Tomimori |
| 2006/0085384 A1 | 4/2006 | Sato et al. |
| 2006/0161847 A1 | 7/2006 | Holecek et al. |
| 2006/0183505 A1 | 8/2006 | Willrich |
| 2006/0190838 A1 | 8/2006 | Nadamoto |
| 2007/0036346 A1 | 2/2007 | Kwon |
| 2007/0048717 A1 | 3/2007 | Hsieh |
| 2007/0234222 A1 | 10/2007 | Yamaguchi et al. |
| 2008/0096593 A1 | 4/2008 | Park |
| 2008/0111822 A1 | 5/2008 | Horowitz et al. |
| 2008/0119237 A1 | 5/2008 | Kim |
| 2008/0148152 A1 | 6/2008 | Blinnikka et al. |
| 2008/0152297 A1 | 6/2008 | Ubillos |
| 2008/0165152 A1 | 7/2008 | Forstall et al. |
| 2008/0204424 A1 | 8/2008 | Jin et al. |
| 2008/0307350 A1 | 12/2008 | Sabatelli et al. |
| 2009/0061970 A1* | 3/2009 | Wylie ............... A63F 13/10 463/1 |
| 2009/0113330 A1 | 4/2009 | Garrison et al. |
| 2009/0143141 A1 | 6/2009 | Wells et al. |
| 2009/0177617 A1 | 7/2009 | Lee |
| 2009/0199128 A1 | 8/2009 | Matthews et al. |
| 2009/0204925 A1 | 8/2009 | Bhat et al. |
| 2009/0278806 A1 | 11/2009 | Duarte et al. |
| 2009/0298418 A1 | 12/2009 | Michael et al. |
| 2009/0307623 A1 | 12/2009 | Agarawala et al. |
| 2009/0319672 A1 | 12/2009 | Reisman |
| 2010/0007603 A1 | 1/2010 | Kirkup |
| 2010/0050111 A1 | 2/2010 | Duffy |
| 2010/0064244 A1 | 3/2010 | Kilpatrick, II et al. |
| 2010/0064536 A1 | 3/2010 | Caskey et al. |
| 2010/0079355 A1* | 4/2010 | Kilpatrick, II ........ G06F 1/1616 345/1.3 |
| 2010/0081475 A1 | 4/2010 | Chiang et al. |
| 2010/0085274 A1 | 4/2010 | Kilpatrick, II et al. |

(56) References Cited

U.S. PATENT DOCUMENTS

| | | |
|---|---|---|
| 2010/0085382 A1 | 4/2010 | Lundqvist et al. |
| 2010/0144433 A1 | 6/2010 | Yamada et al. |
| 2010/0146422 A1 | 6/2010 | Seong et al. |
| 2010/0146428 A1 | 6/2010 | Ng et al. |
| 2010/0169822 A1 | 7/2010 | Hollemans |
| 2010/0182247 A1 | 7/2010 | Petschnigg et al. |
| 2010/0188352 A1 | 7/2010 | Ikeda |
| 2010/0211872 A1 | 8/2010 | Rolston et al. |
| 2010/0245106 A1 | 9/2010 | Miller et al. |
| 2010/0245209 A1 | 9/2010 | Miller et al. |
| 2010/0289826 A1 | 11/2010 | Park et al. |
| 2011/0107272 A1 | 5/2011 | Aguilar |
| 2011/0119611 A1 | 5/2011 | Ahn et al. |
| 2011/0143769 A1 | 6/2011 | Jones et al. |
| 2011/0167380 A1 | 7/2011 | Stallings et al. |
| 2011/0187662 A1 | 8/2011 | Lee et al. |
| 2011/0193806 A1* | 8/2011 | Kim ..................... G06F 1/1615 345/173 |
| 2011/0202834 A1 | 8/2011 | Mandryk et al. |
| 2011/0209102 A1 | 8/2011 | Hinckley et al. |
| 2011/0237303 A1 | 9/2011 | Matsuda |
| 2012/0005269 A1 | 1/2012 | Janssen et al. |
| 2012/0081268 A1 | 4/2012 | Sirpal et al. |
| 2012/0081309 A1 | 4/2012 | Sirpal et al. |
| 2012/0081311 A1 | 4/2012 | Sirpal et al. |
| 2012/0081400 A1 | 4/2012 | Schrock et al. |
| 2012/0084675 A1 | 4/2012 | Sirpal et al. |
| 2012/0084737 A1 | 4/2012 | Gimpl et al. |
| 2012/0117495 A1 | 5/2012 | Sirpal et al. |
| 2012/0124515 A1 | 5/2012 | Li et al. |
| 2012/0266098 A1 | 10/2012 | Webber |
| 2013/0021262 A1 | 1/2013 | Chen |
| 2013/0076673 A1 | 3/2013 | Sirpal et al. |
| 2013/0079062 A1 | 3/2013 | Sirpal et al. |
| 2013/0097532 A1 | 4/2013 | Reeves et al. |
| 2013/0100001 A1 | 4/2013 | Reeves et al. |
| 2015/0242070 A1 | 8/2015 | Sirpal et al. |
| 2016/0085406 A1 | 3/2016 | Sirpal et al. |

FOREIGN PATENT DOCUMENTS

| | | |
|---|---|---|
| EP | 1648149 | 4/2006 |
| JP | 2003-316563 | 11/2003 |
| JP | 2005-037747 | 2/2005 |
| WO | WO 2010/028403 | 3/2010 |
| WO | WO 2012/044780 | 4/2012 |
| WO | WO 2012/044801 | 4/2012 |
| WO | WO 2012/044809 | 4/2012 |

OTHER PUBLICATIONS

Google images, accessed Apr. 18, 2011, 6 pages.

"iPhone User Guide for iPhone OS 3.1 Software," Apple Inc., 2009, 217 pages.

Website entitled, "Kyocera Echo," at www.echobykyocera.com/, 2011, 6 pages.

Website entitled, "Sony Tablet," at www.store.sony.com/webapp/wcs/stores/servlet/CategoryDisplay?catalogId=10551&storeId=10151&langId=-1&categoryId=8198552921644795521, 2011, 3 pages.

Burns, "Motorola ATRIX 4G Laptop Dock Review," at www.androidcommunity.com/motorola-atrix-4g-laptop-dock-review-20110220/, Feb. 20, 2011, 5 pages.

Catacchio, "This smartphone has two huge screens . . . that rotate," The Next Web at www.thenextweb.com/asia/2010/10/07/this-smartphone-has-two-huge-screens-that-rotate/, Jul. 21, 2011, 2 pages.

Harman03, "Kyocera Echo Dual-screen Android Phone," posted 4 weeks from Apr. 18, 2011, 3 pages.

"Lapdock™ for Motorola ATRIX," at www.motorola.com/Consumers/US-EN/Consumer-Product-and-Services/Mobile . . . , accessed Apr. 18, 2011, 1 page.

"Motorola ATRIX 4G Laptop Dock Review," at www.phonearena.com/reviews/Motorola-ATRIX-4G-Laptop-Dock-Review_id2667, Mar. 2, 2011, 6 pages.

"Windows Media Player 10 Mobile for Smartphone." Microsoft Corporation, 2004, 20 pages.

Ritchie, "iOS 4 features: Background app killing," imore.com, Aug. 10, 2010 [retrieved Dec. 14, 2013], 3 pages. Retrieved from: www.imore.com/ios-4-features-background-app-killing.

Soegaard, "Affordances." Interaction Design Foundation, (2010), 7 pages, [Retrieved May 29, 2013 from www.interaction-design.org/encyclopedia/affordances.html].

Stein, S., "How does the Motorola Atrix 4G Lapdock compare with a laptop?" Crave—CNET, at www.news.cnet.com/8301-17938_105-20031251-1.html, Feb. 9, 2011, 7 pages.

International Search Report and Written Opinion for International Patent Application No. PCT/US11/53942, mailed Feb. 21, 2012, 8 pages.

International Preliminary Report on Patentability for International (PCT) Patent Application No. PCT/US2011/053942, mailed Apr. 11, 2013 7 pages.

Extended European Search Report for European Patent Application No. 11829892.6 dated Jul. 2, 2014, 7 pages.

International Search Report and Written Opinion for International Patent Application No. PCT/US11/53902, mailed Feb. 22, 2012, 9 pages.

International Preliminary Report on Patentability for International (PCT) Patent Application No. PCT/US2011/053902, mailed Apr. 11, 2013 8 pages.

International Search Report and Written Opinion for International Patent Application No. PCT/US11/53963, mailed Feb. 22, 2012, 7 pages.

International Preliminary Report on Patentability for International (PCT) Patent Application No. PCT/US2011/053963, mailed Apr. 11, 2013 6 pages.

Official Action for U.S. Appl. No. 13/247,982, mailed Aug. 15, 2013, 14 pages.

Official Action for U.S. Appl. No. 13/247,982 mailed Feb. 5, 2014, 13 pages.

Official Action for U.S. Appl. No. 13/247,982 mailed Nov. 13, 2014, 17 pages.

Official Action for U.S. Appl. No. 13/247,797, mailed Sep. 12, 2013 13 pages.

Notice off Allowance for U.S. Appl. No. 13/247,797, mailed Oct. 11, 2013 13 pages.

Official Action for U.S. Appl. No. 13/247,369, mailed Oct. 10, 2013 16 pages.

Official Action for U.S. Appl. No. 13/247,369 mailed May 2, 2014 21 pages.

Official Action for U.S. Appl. No. 13/247,369 mailed Jan. 7, 2015 7 pages.

Official Action for U.S. Appl. No. 13/247,708, mailed Sep. 12, 2014, 8 pages.

Official Action for U.S. Appl. No. 13/223,778, mailed Jun. 6, 2013 38 pages.

Official Action for U.S. Appl. No. 13/223,778, mailed Nov. 7, 2013 37 pages.

Official Action for U.S. Appl. No. 13/223,778, mailed Oct. 3, 2014 42 pages.

Official Action for U.S. Appl. No. 13/366,483 mailed May 23, 2014, 18 pages.

Notice of Allowance for U.S. Appl. No. 13/366,483, mailed Oct. 24, 2014, 7 pages.

Official Action for U.S. Appl. No. 13/624,591, mailed Dec. 4, 2014, 27 pages.

Official Action for U.S. Appl. No. 13/627,577, mailed Aug. 1, 2014 18 pages.

Notice of Allowance for U.S. Appl. No. 13/627,577, mailed Nov. 26, 2014 11 pages.

Official Action for U.S. Appl. No. 13/629,211 mailed Apr. 17, 2014, 14 pages.

Official Action for U.S. Appl. No. 13/629,211 mailed Oct. 16, 2014, 14 pages.

(56) References Cited

OTHER PUBLICATIONS

Official Action for U.S. Appl. No. 13/629,211 mailed Jan. 16, 2015, 16 pages.
Official Action for U.S. Appl. No. 13/629,211 mailed Jun. 18, 2015, 18 pages.
Official Action (with English translation) for Chinese Patent Application No. 201180057998.3, dated Nov. 30, 2015, 21 pages.
Official Action (with English summary) for Japanese Patent Application No. 2013-531850, dated Oct. 27, 2015, 4 pages.
Notice of Allowance for U.S. Appl. No. 13/247,982 mailed May 28, 2015, 8 pages.
Notice of Allowance for U.S. Appl. No. 13/247,369 mailed Aug. 11, 2015 17 pages.
Official Action for U.S. Appl. No. 13/223,778, mailed Apr. 24, 2015 48 pages.
Notice of Allowance for U.S. Appl. No. 13/366,483, mailed Apr. 3, 2015, 5 pages.
Official Action for U.S. Appl. No. 13/624,591, mailed Jun. 19, 2015, 34 pages.

* cited by examiner

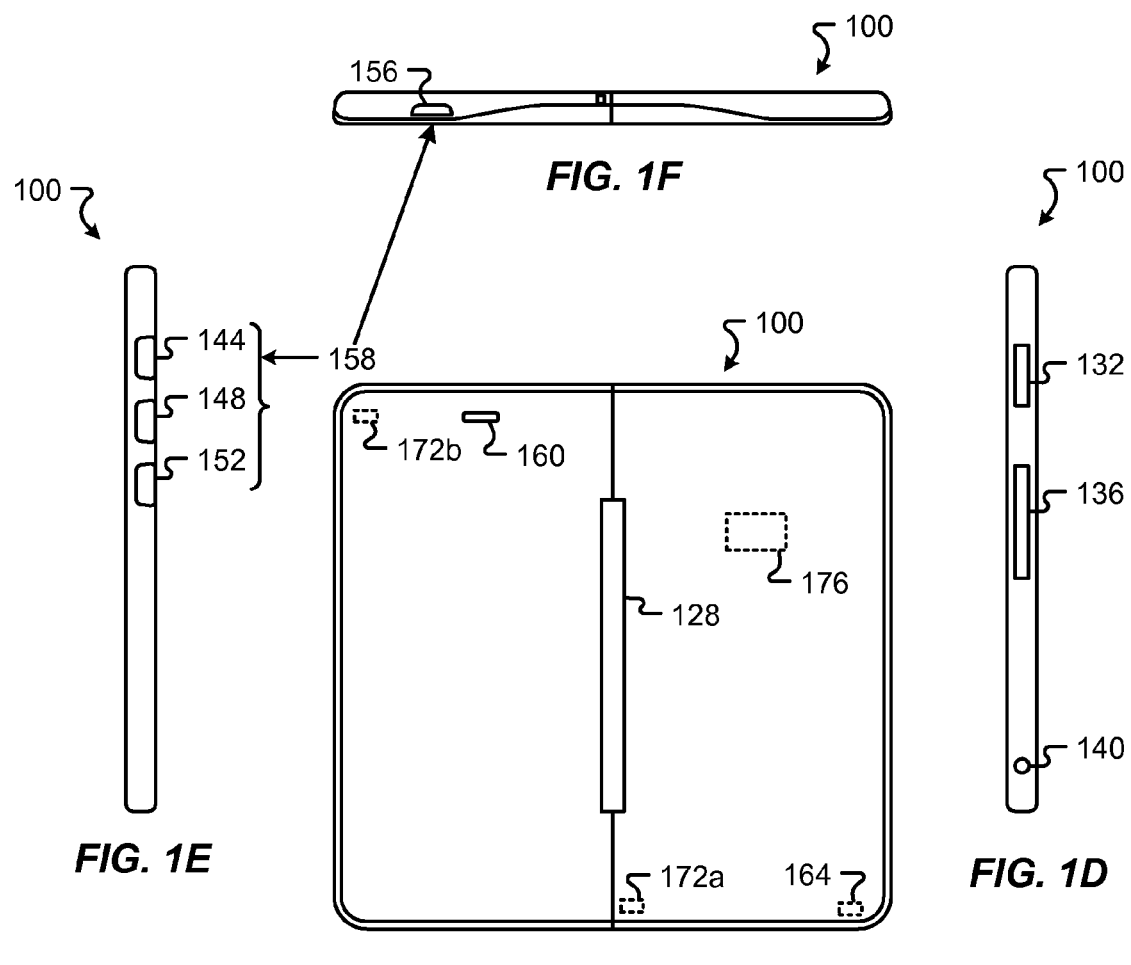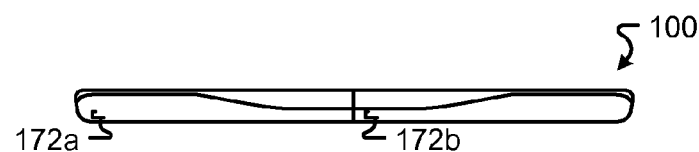

| | | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
|---|---|---|---|---|---|---|---|---|---|---|---|---|---|
| | | PORTRAIT | | | | | | LANDSCAPE | | | | | |
| P O R T R A I T | OPEN | X | HT | HT | HT | P | I | AT | HAT | HAT | HAT | P | I |
| | CLOSED | HT | X | HAT | HAT | P | I | HAT | AT | HAT | HAT | P | I |
| | EASEL | HT | HT | X | X | P | I | HAT | HAT | HAT | HAT | P | I |
| | PHONE | HT | X | HT | HT | X | X | HAT | HAT | HAT | HAT | X | I |
| | IMAGE/VIDEO | HT | HT | HT | X | P | X | HAT | HAT | HAT | HAT | X | HAT |
| L A N D S C A P E | OPEN | AT | HAT | HAT | HAT | P | I | X | HT | HAT | HAT | P | I |
| | CLOSED | HAT | AT | HAT | HAT | P | I | HT | X | HAT | HAT | P | I |
| | EASEL | HAT | HAT | HAT | HAT | P | I | HT | HT | HAT | HAT | P | I |
| | MODIFIED EASEL | HAT | HAT | HAT | HAT | HAT | AT | HT | HT | X | HAT | P | I |
| | IMAGE/VIDEO | HAT | HAT | HAT | HAT | P | P | HT | HT | HAT | X | P | X |
| DOCKED | | | | | | | | | | | | | |

DOCKING SIGNAL

*FIG. 3B*

Key:
H - Hall Effect Sensor(s)
a - accelerometer(s)
T - Timer
P – communications Trigger
I – Image / Video capture Request Tap Long Press Drag Flick Pinch Spread

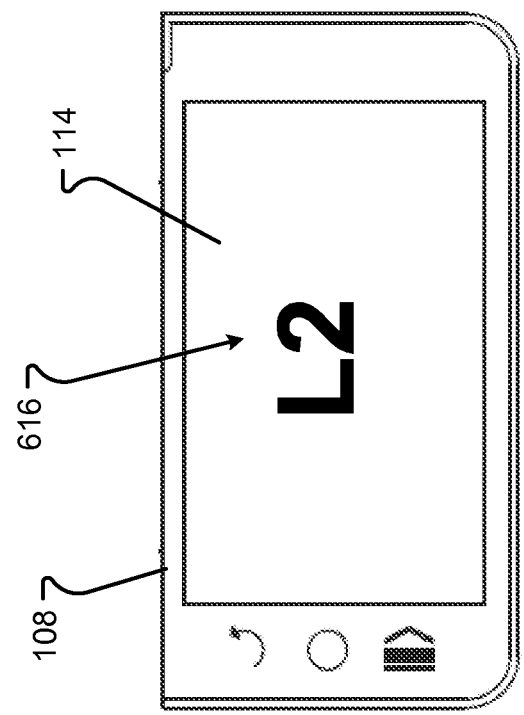
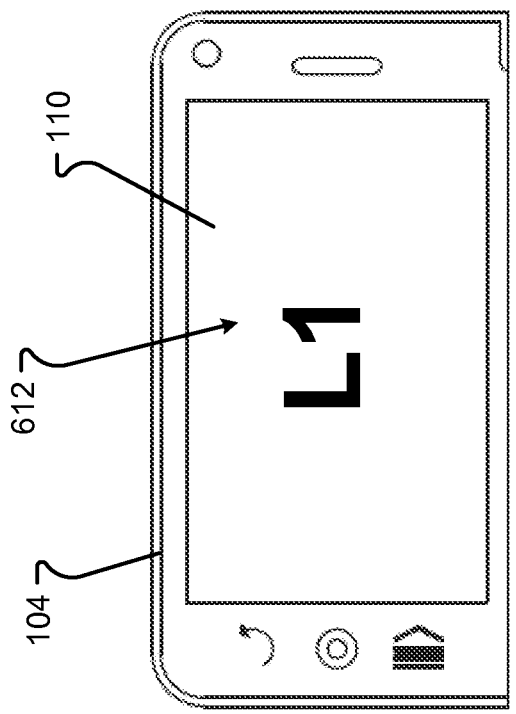
FIG. 6E
FIG. 6D

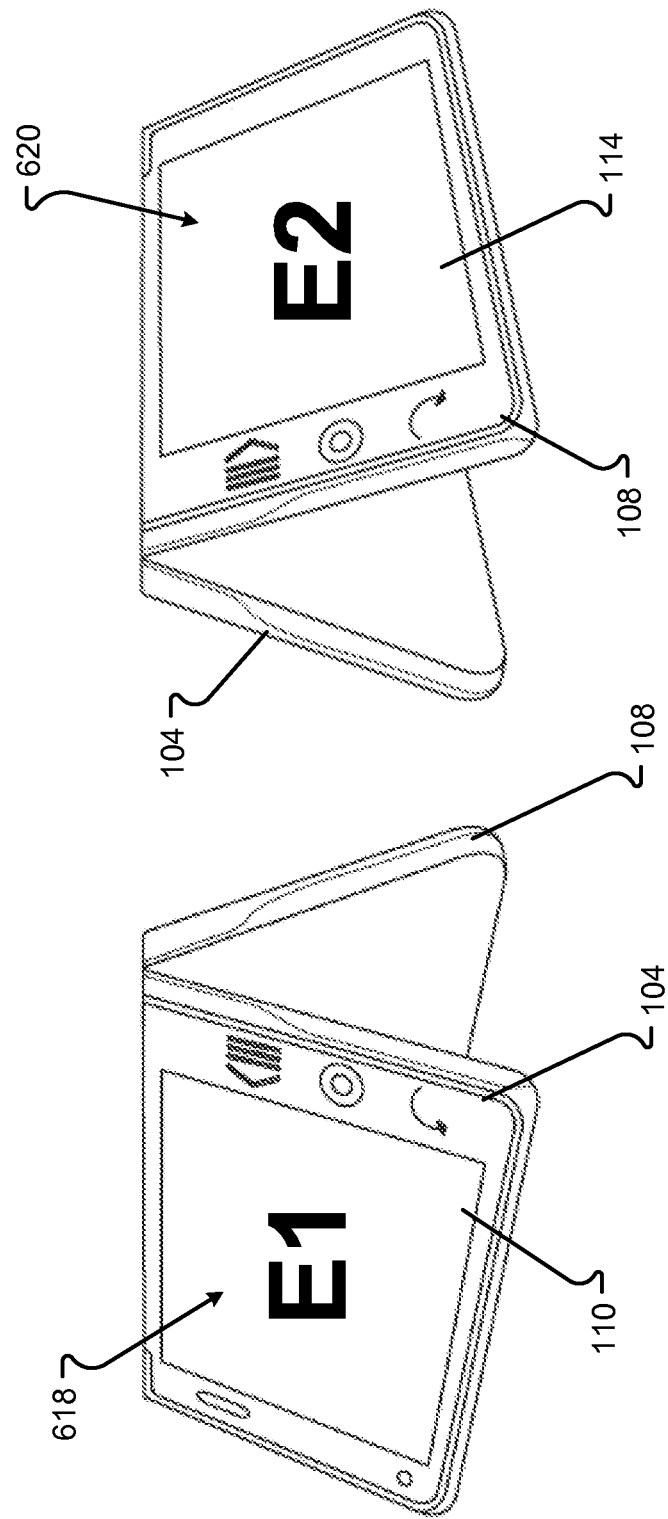

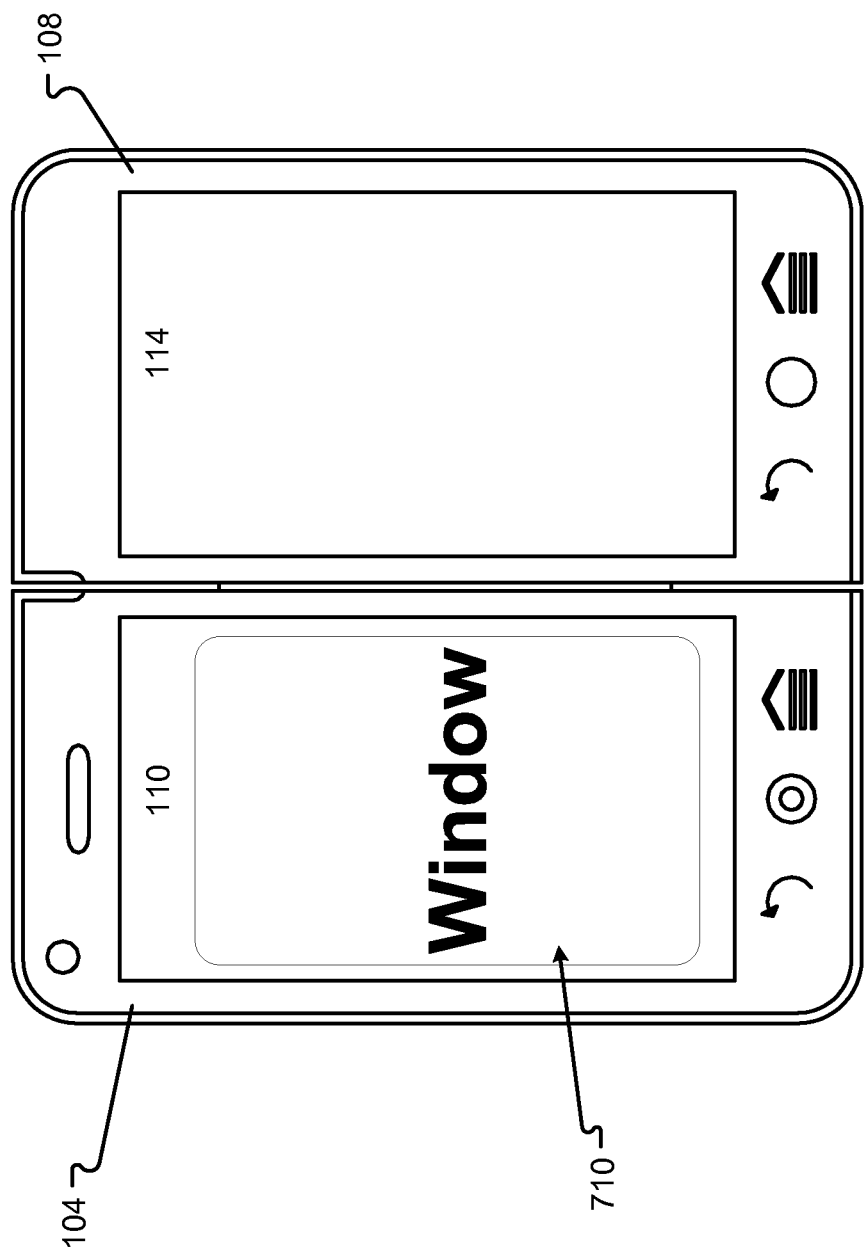

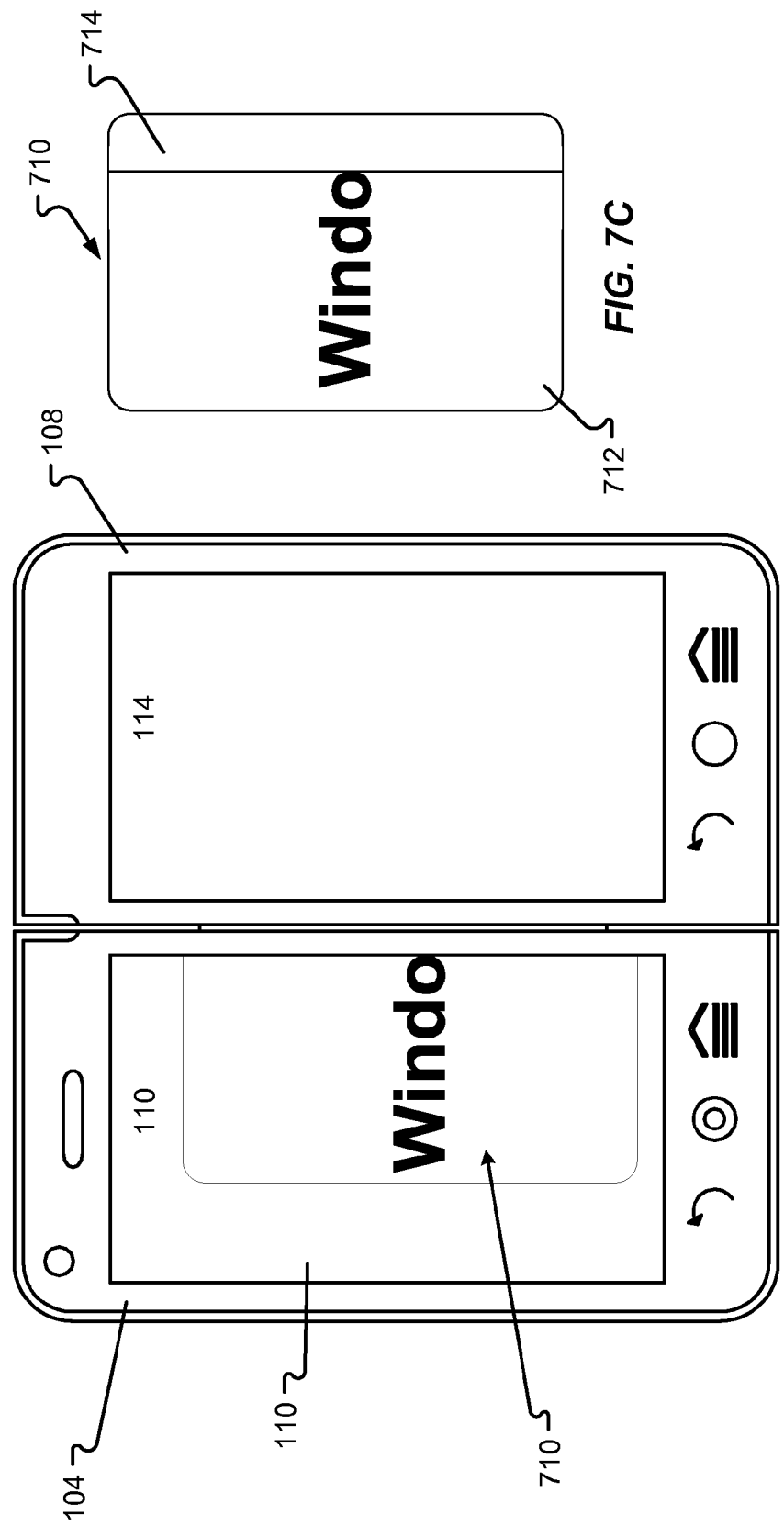

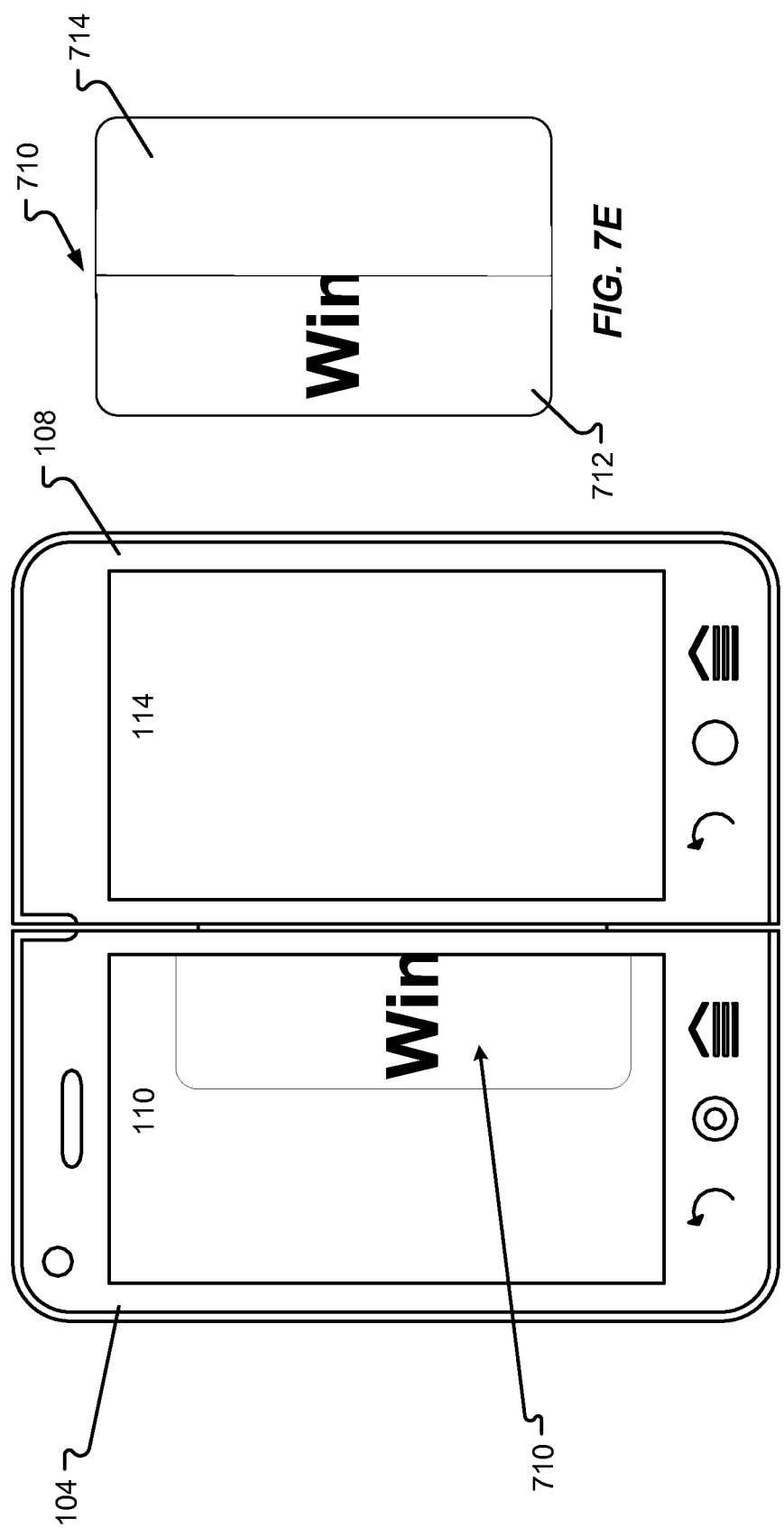

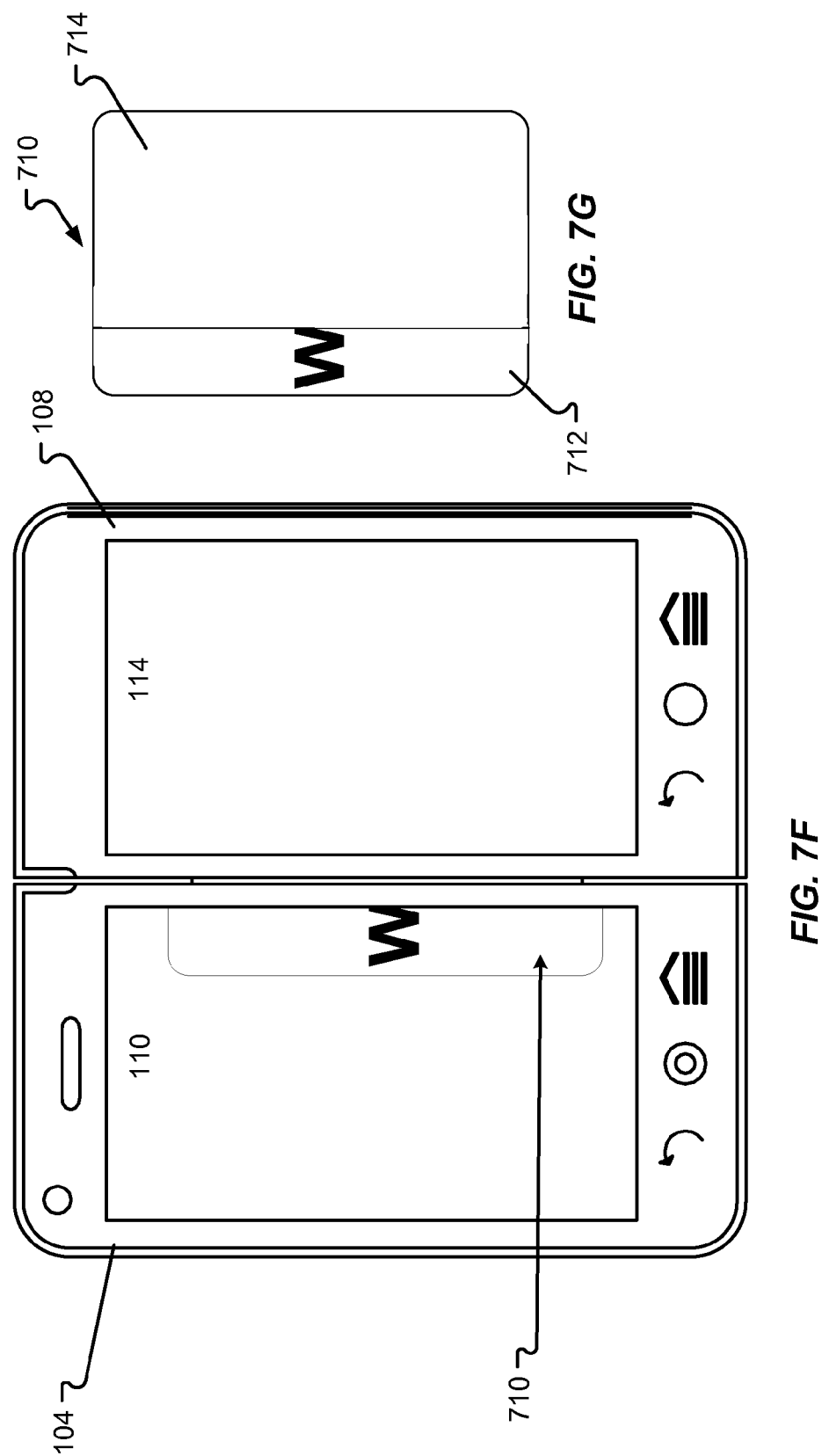

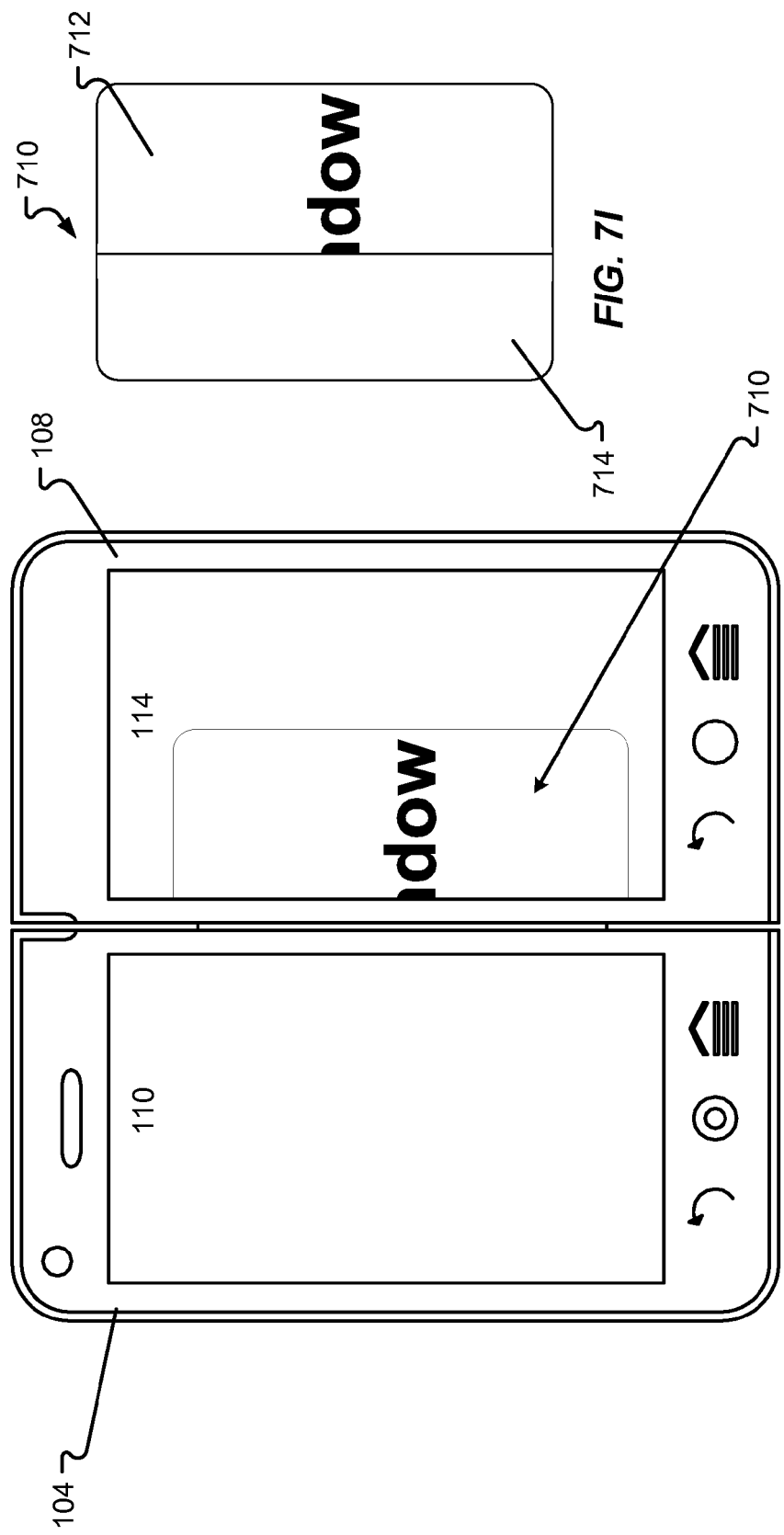

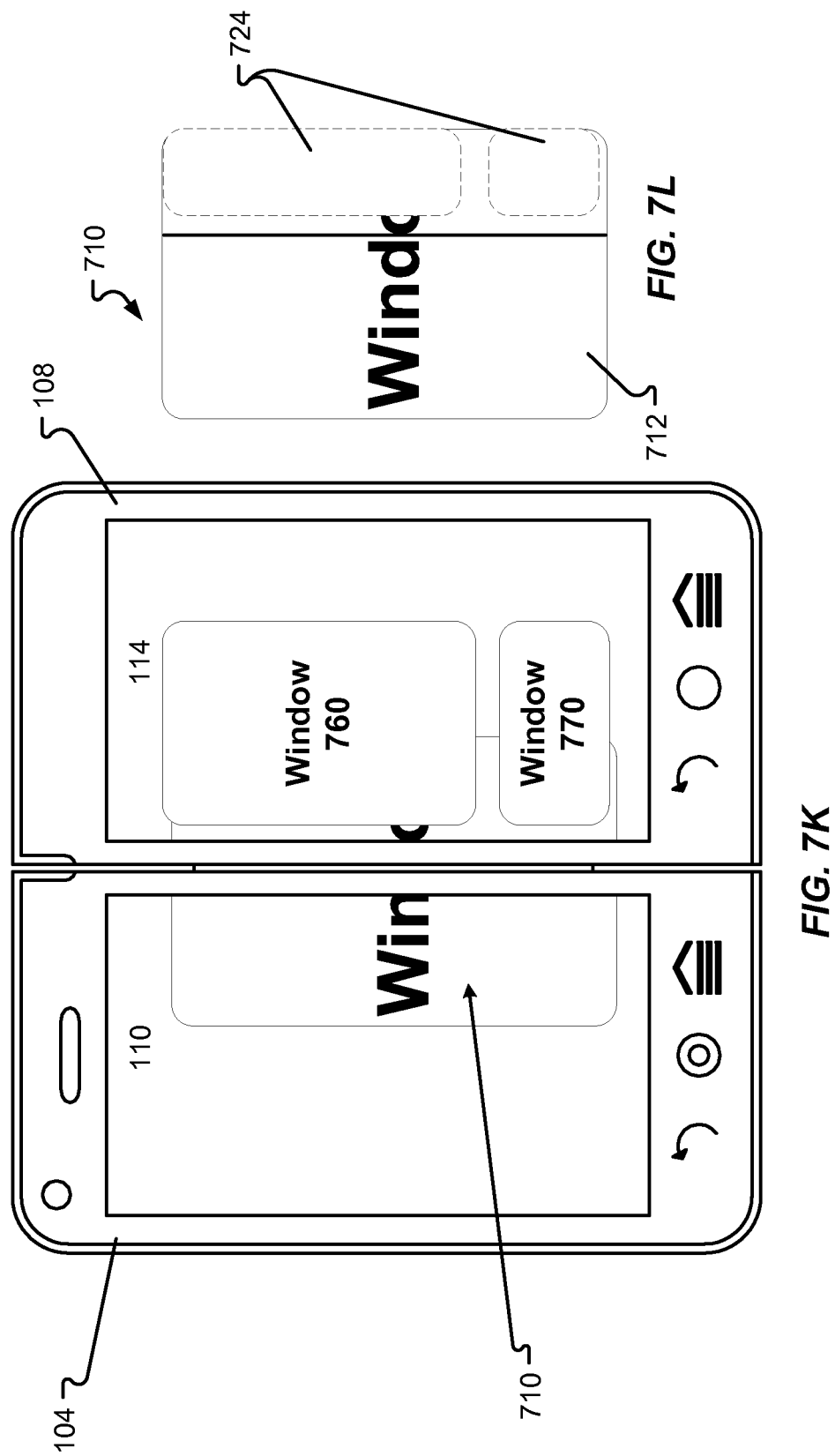

DISPLAY CLIPPING ON A MULTISCREEN DEVICE

CROSS REFERENCE TO RELATED APPLICATION

The present application is a continuation of and claims priority to U.S. patent application Ser. No. 13/629,211, filed Sep. 27, 2012, entitled "DISPLAY CLIPPING," which claims the benefits of and priority, under 35 U.S.C. §119(e), to U.S. Provisional Application Ser. No. 61/539,884, filed Sep. 27, 2011, entitled "MOBILE DEVICE;" each of which is incorporated herein by reference in its entirety for all that it teaches and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other hand, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

In one embodiment, a method includes providing a device having at least first and second screens and displaying an image in a first display of a first screen, wherein the image is displayed entirely within a display area of the first display. A determination is then made by at least one processor as to whether the image displayed in the first display of the first screen requires clipping. If the image displayed in the first display of the first screen requires clipping, then the image displayed in the first display of the first screen is clipped such that a first portion of the image is displayed in the first display of the first screen and a second portion of the image is prevented from being displayed in a first display of a second screen.

Another embodiment is directed to a non-transitory computer readable medium storing computer executable instructions that when executed by at least one processor perform a method that includes displaying an image in a first display of a first screen and determining if the image displayed in the first display of the first screen requires clipping. If the image in the first display of a first screen requires clipping, then the image displayed in the first display of the first screen is clipped such that a first portion of the image is displayed in the first display of the first screen and a second portion of the image is prevented from being displayed in a first display of a second screen.

Yet another embodiment is directed to a dual screen communication device. The communication device includes a first display of a first screen, a second display of a second screen, and a computer readable medium that stores computer executable instructions that when executed by at least one processor perform a method that includes displaying an image in a first display of a first screen and determining if the image displayed in the first display of the first screen requires clipping. If the image in the first display of a first screen requires clipping, then the image displayed in the first display of the first screen is clipped such that a first portion of the image is displayed in the first display of the first screen and a second portion of the image is prevented from being displayed in a first display of a second screen.

The present disclosure can provide a number of advantages depending on the particular aspect, embodiment, and/or configuration. In a device that includes more than one screen, a user may desire to reposition an image, window, or application on the more than one screen. However, the user may not desire to move a window such that the window spills over one display and onto another display, potentially blocking other images, windows, and applications which may have content that is of interest to a user. Further, by clipping and not displaying the content that spilled over or exceeded the display area of the display, cpu cycles and power—often battery power, can be saved by not rendering this content. These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composited display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application is incapable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6D is a fourth representation of an embodiment of a device configuration generated in response to the device state;

FIG. 6E is a fifth representation of an embodiment of a device configuration generated in response to the device state;

FIG. 6G is a seventh representation of an embodiment of a device configuration generated in response to the device state;

FIG. 6H is a eighth representation of an embodiment of a device configuration generated in response to the device state;

FIGS. 7A-7L are a representation of an embodiment showing a first display and a second display in which a window is clipped;

Figure 1A:
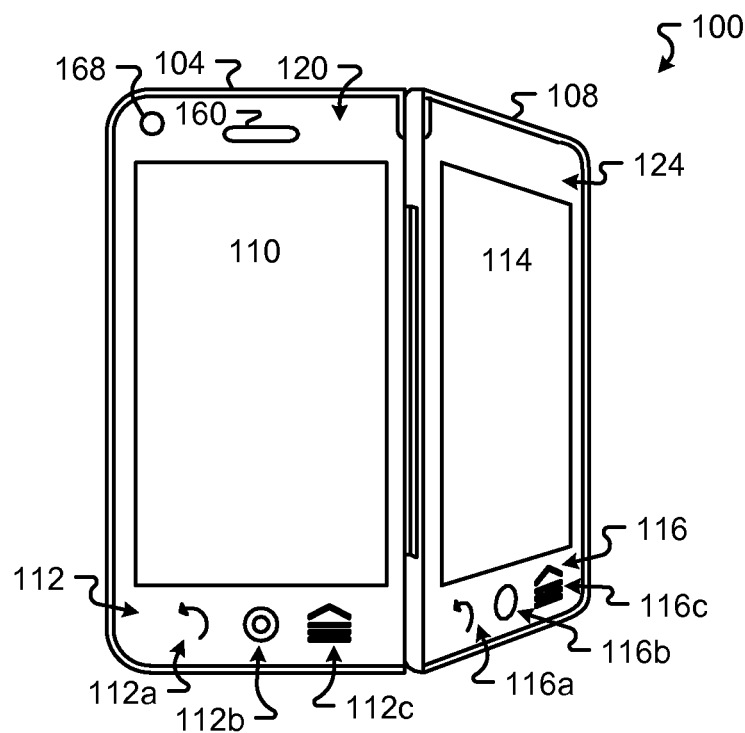
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-C and 116a-C may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
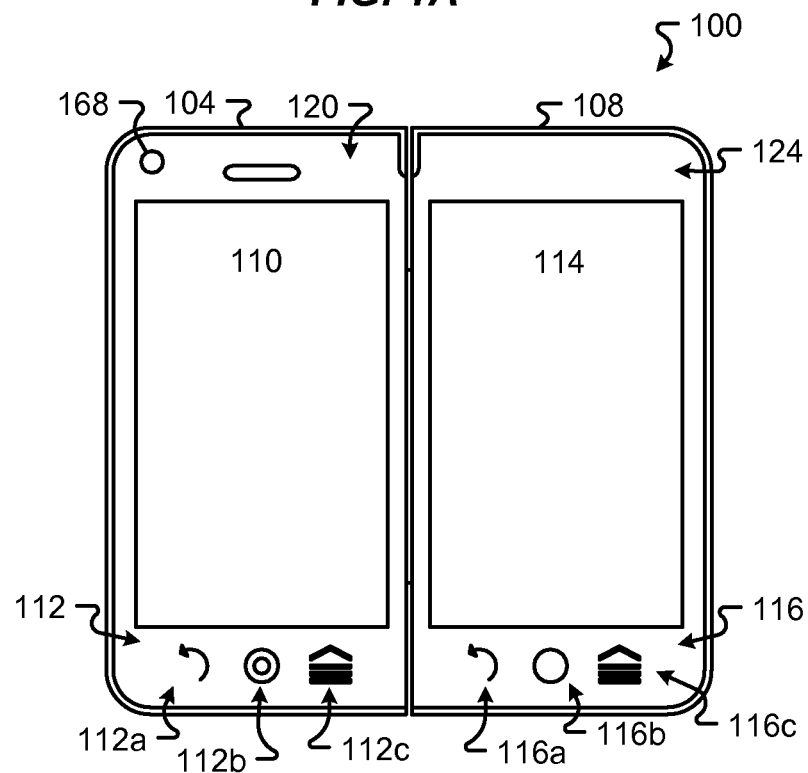
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
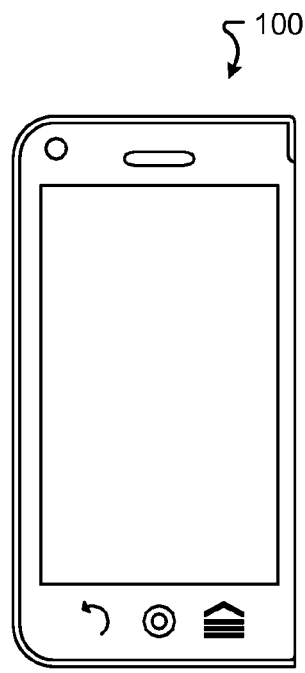
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
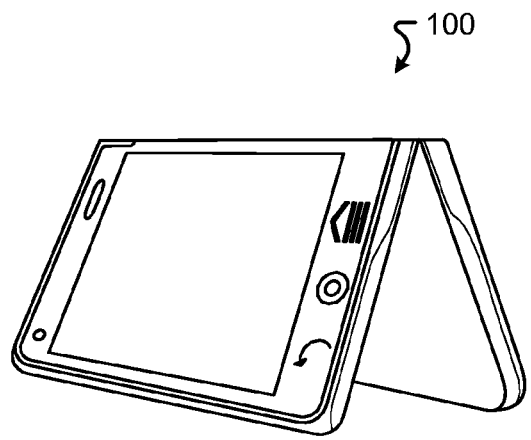
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
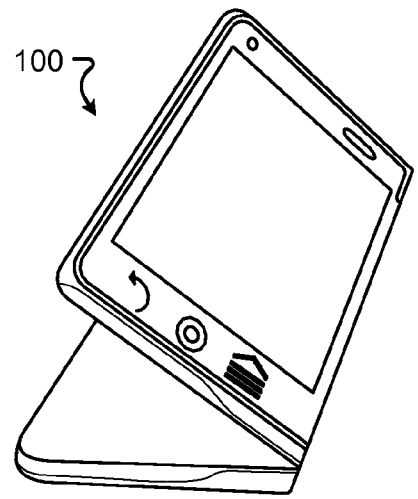
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are non-limiting.

Figure 2:
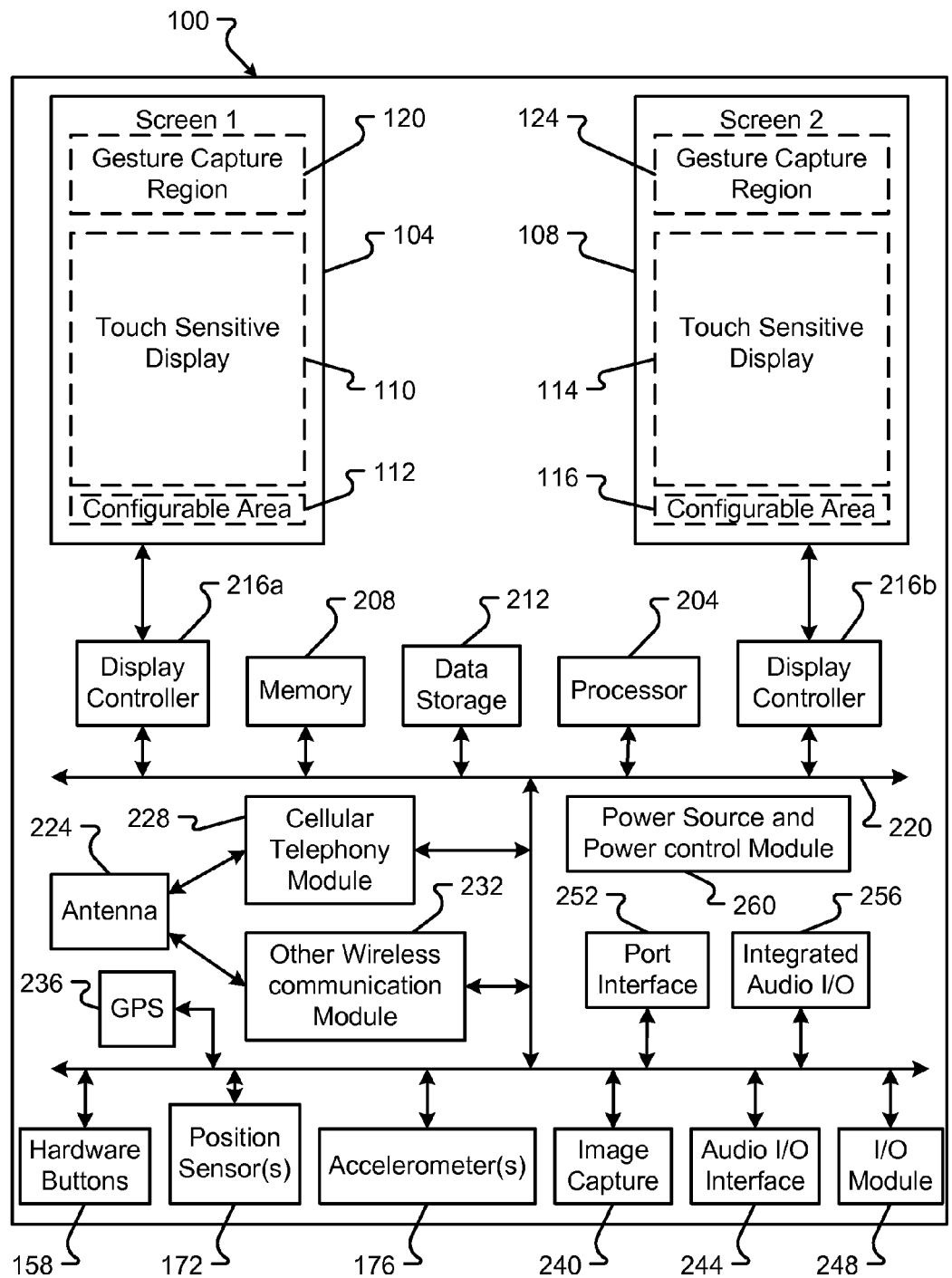
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
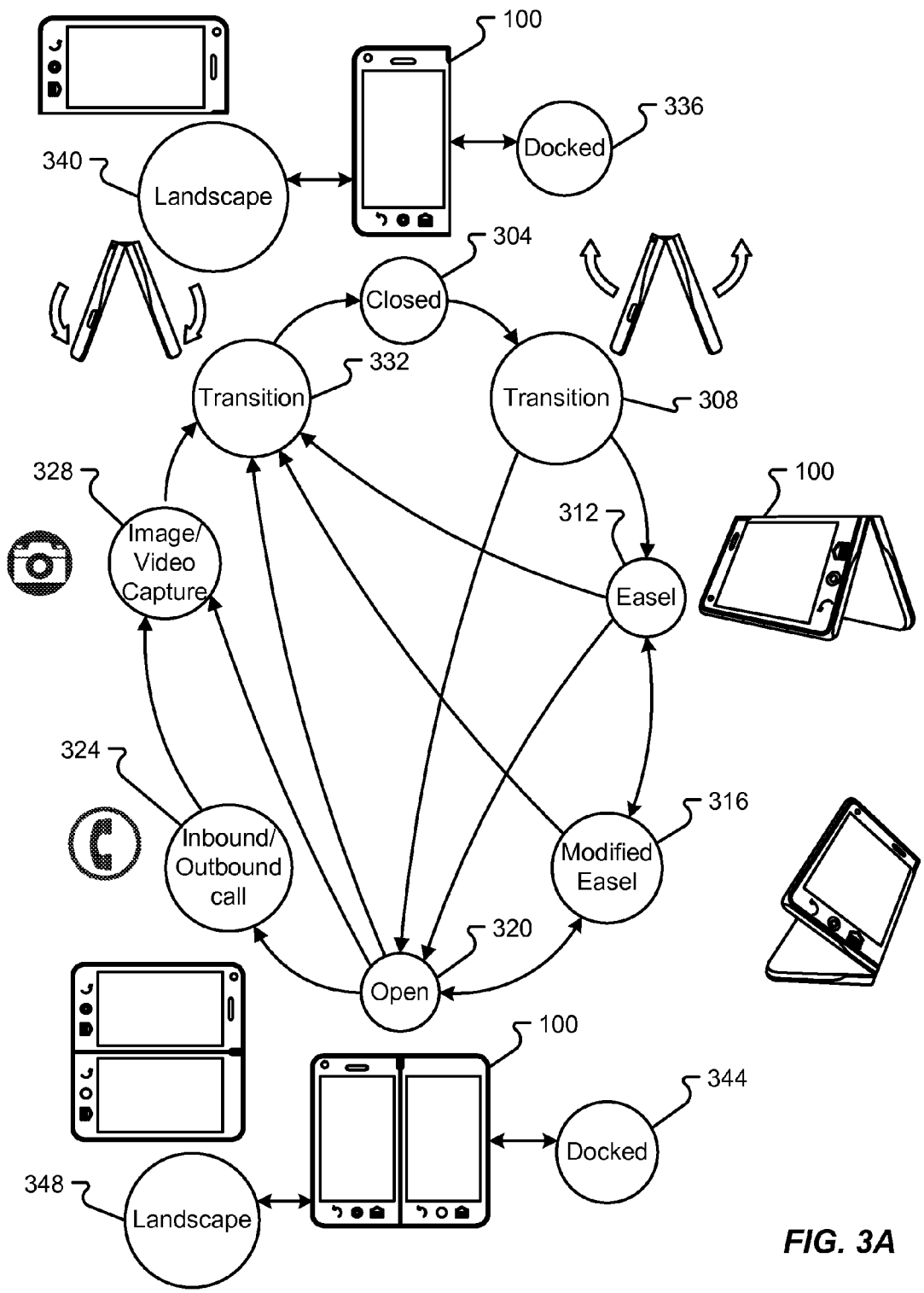
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed but the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 332 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110,114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
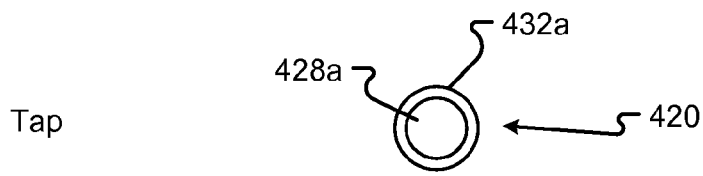
FIG. 4A is a first representation of an embodiment of user gesture received at a device.
Figure 4B:
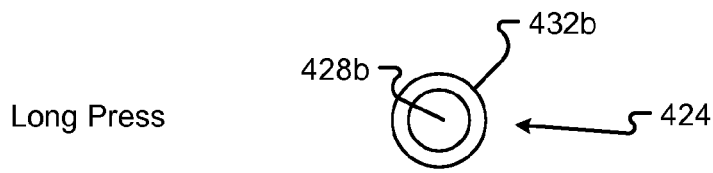
FIG. 4B is a second representation of an embodiment of user gesture received at a device.
Figure 4C:
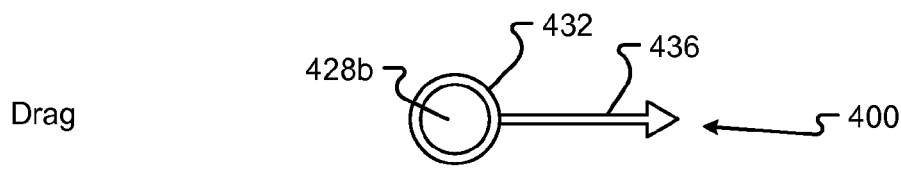
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
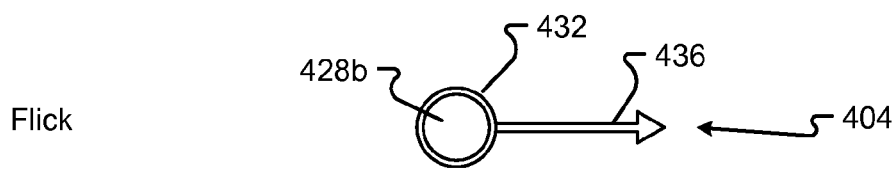
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
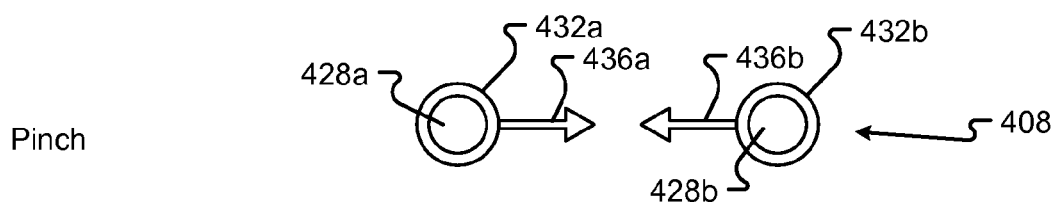
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428 to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
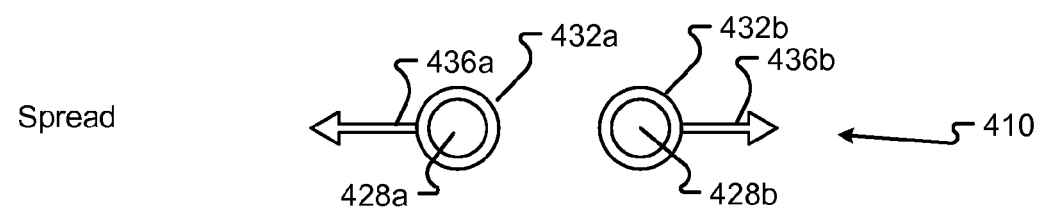
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
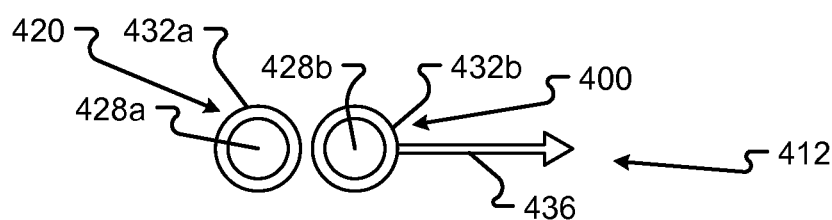
FIG. 4G is a seventh representation of an embodiment of user gesture received at a device.
Figure 4H:
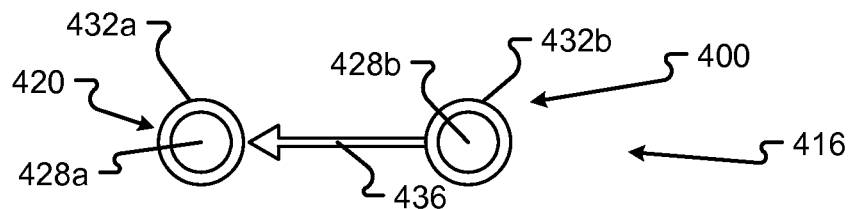
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564*a* and/or 564*b* from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event," which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can up-scale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110,114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
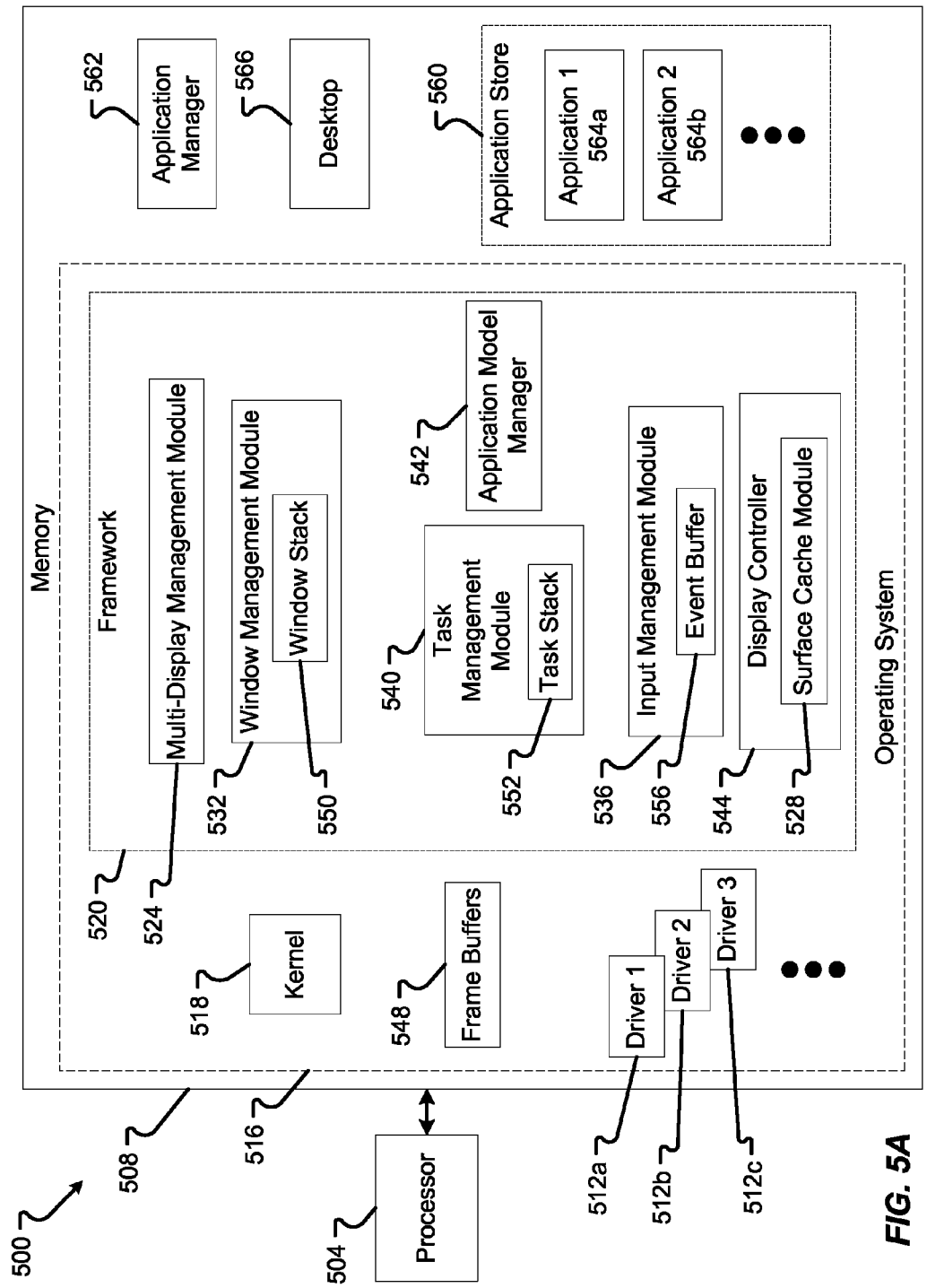
FIG. 5A is a block diagram of an embodiment of the device software and/or firmware.
Figure 5B:
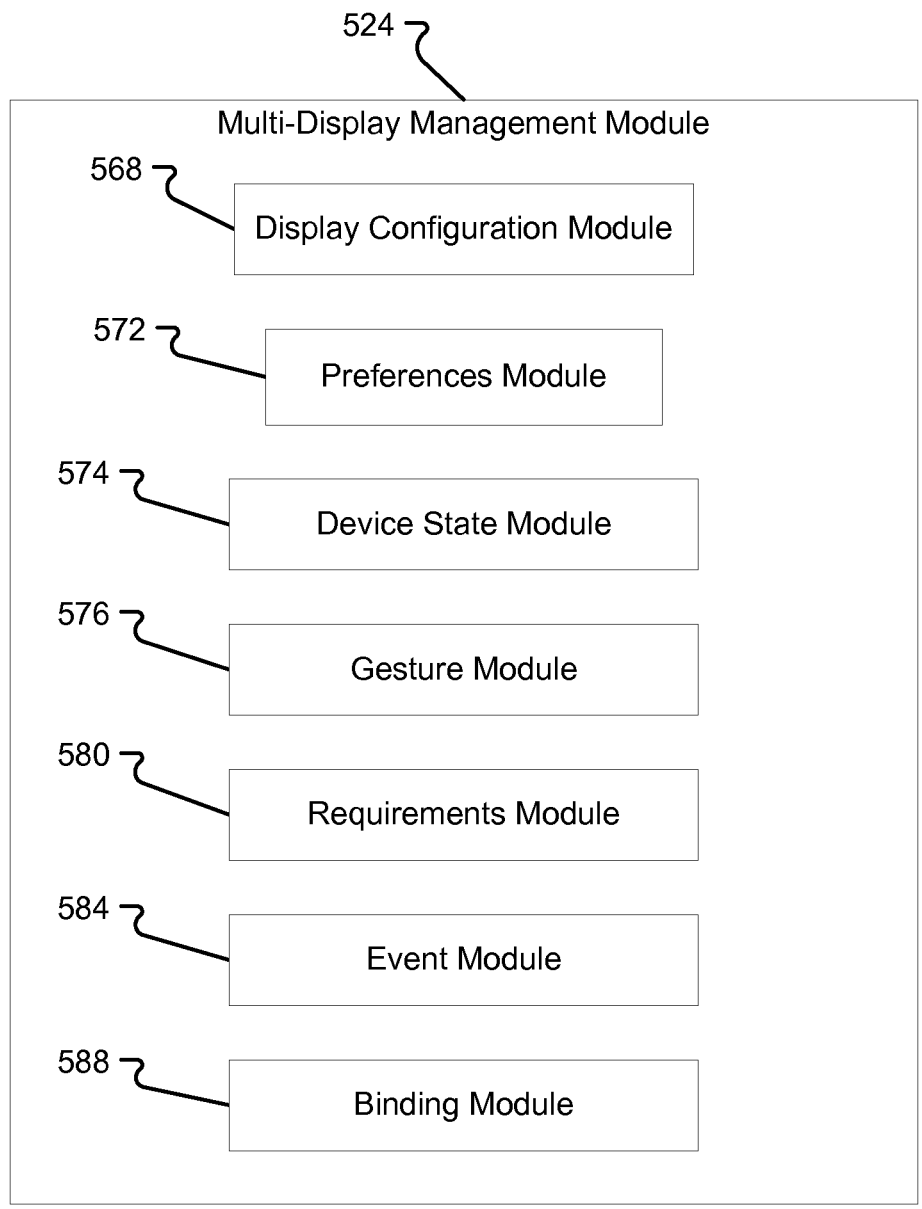
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
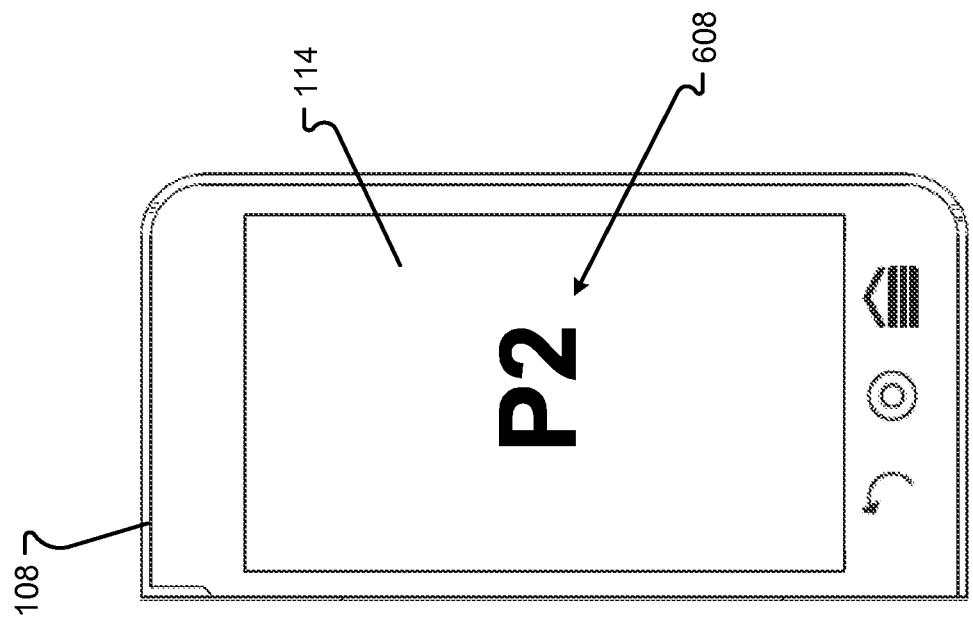
FIG. 6B is a second representation of an embodiment of a device configuration generated in response to the device state.
Figure 6A:
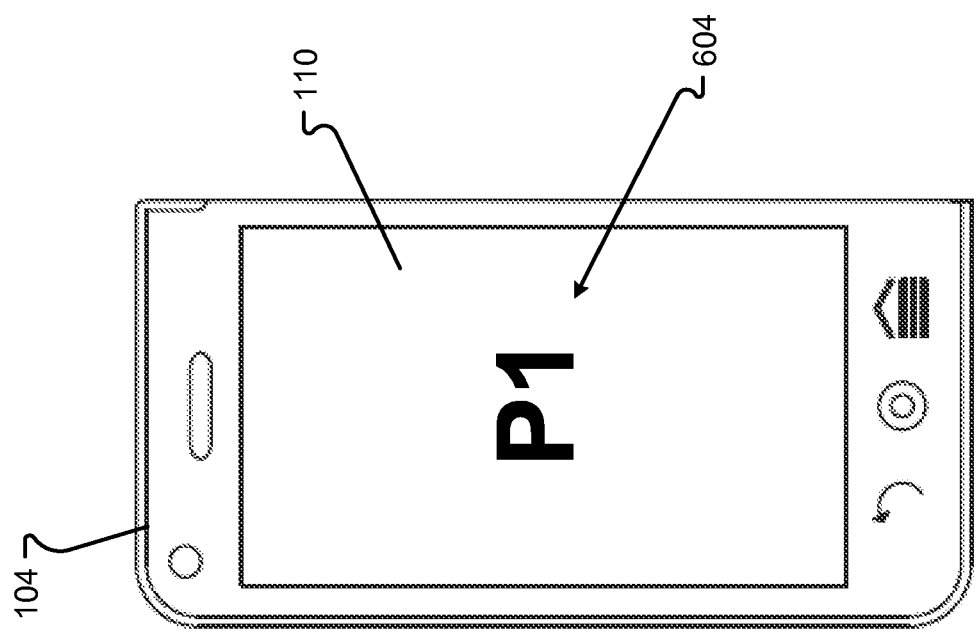
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
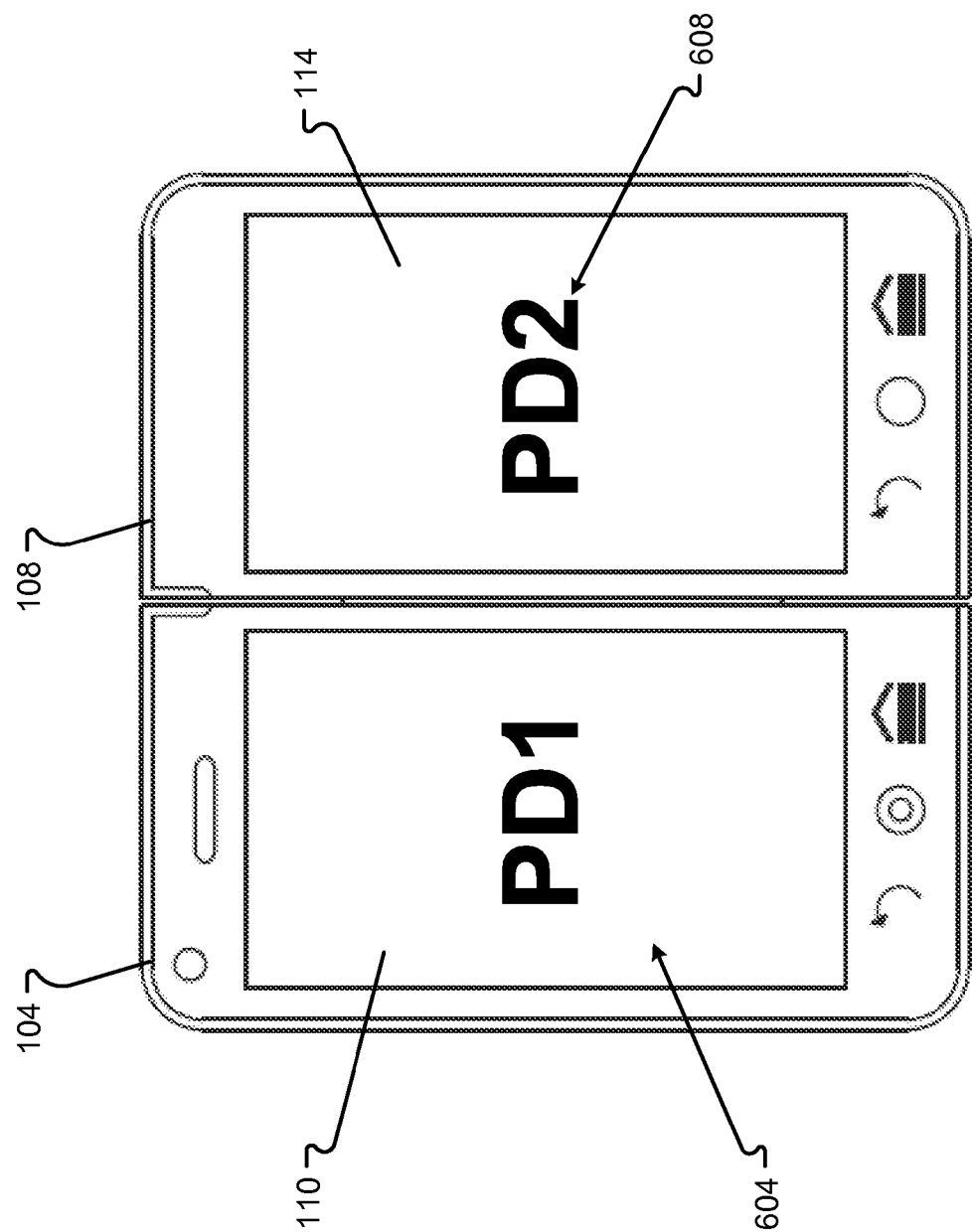
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

Figure 6F:
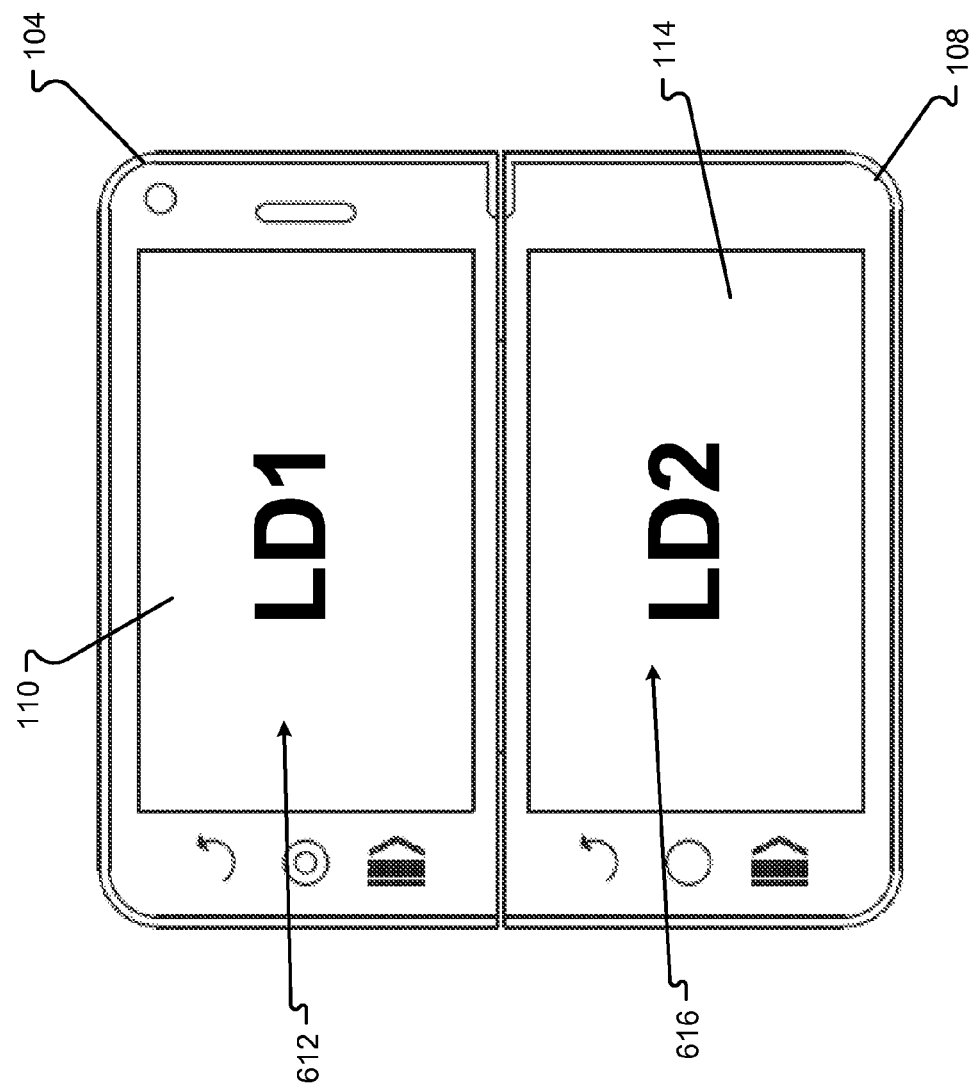
FIG. 6F is a sixth representation of an embodiment of a device configuration generated in response to the device state.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
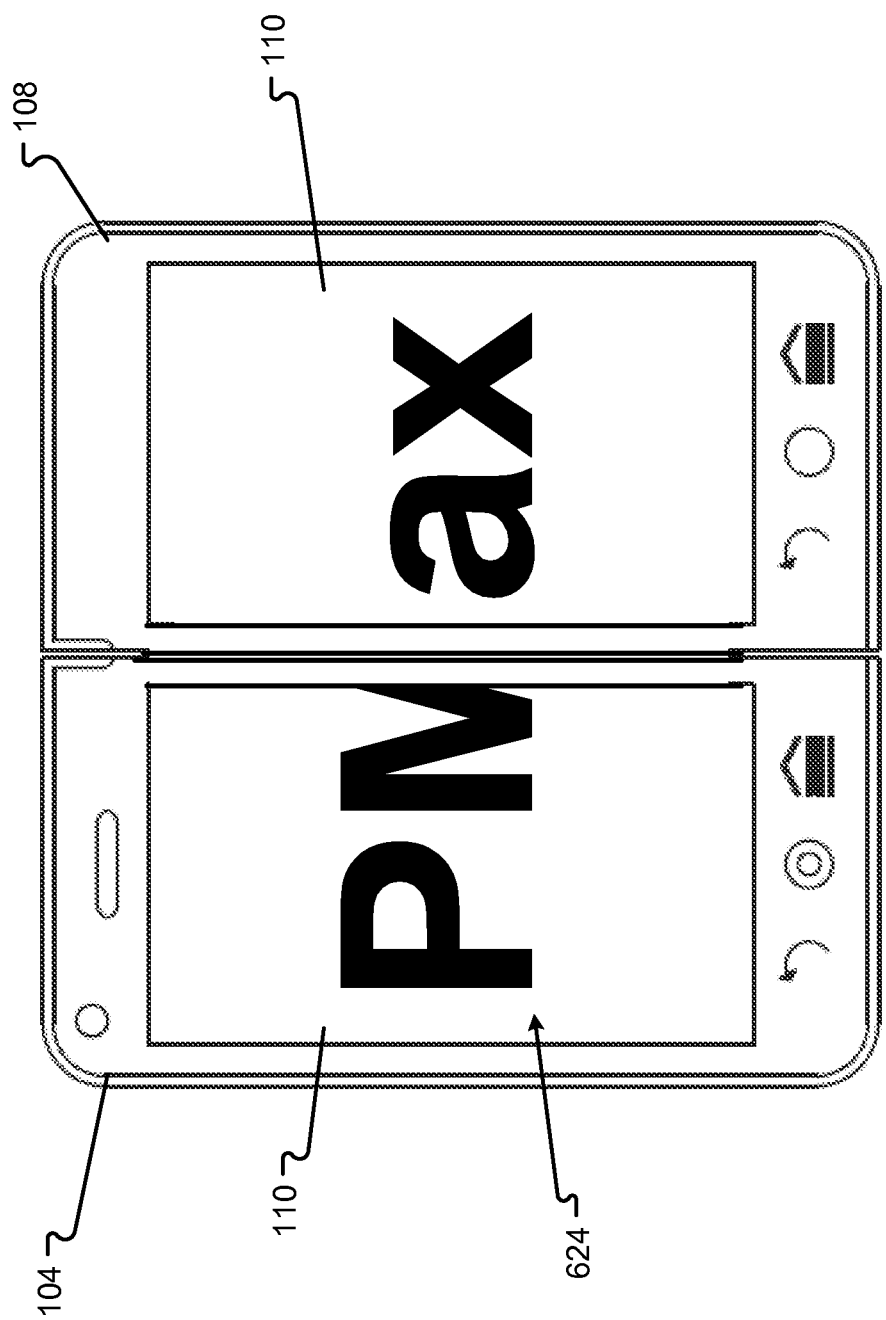
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
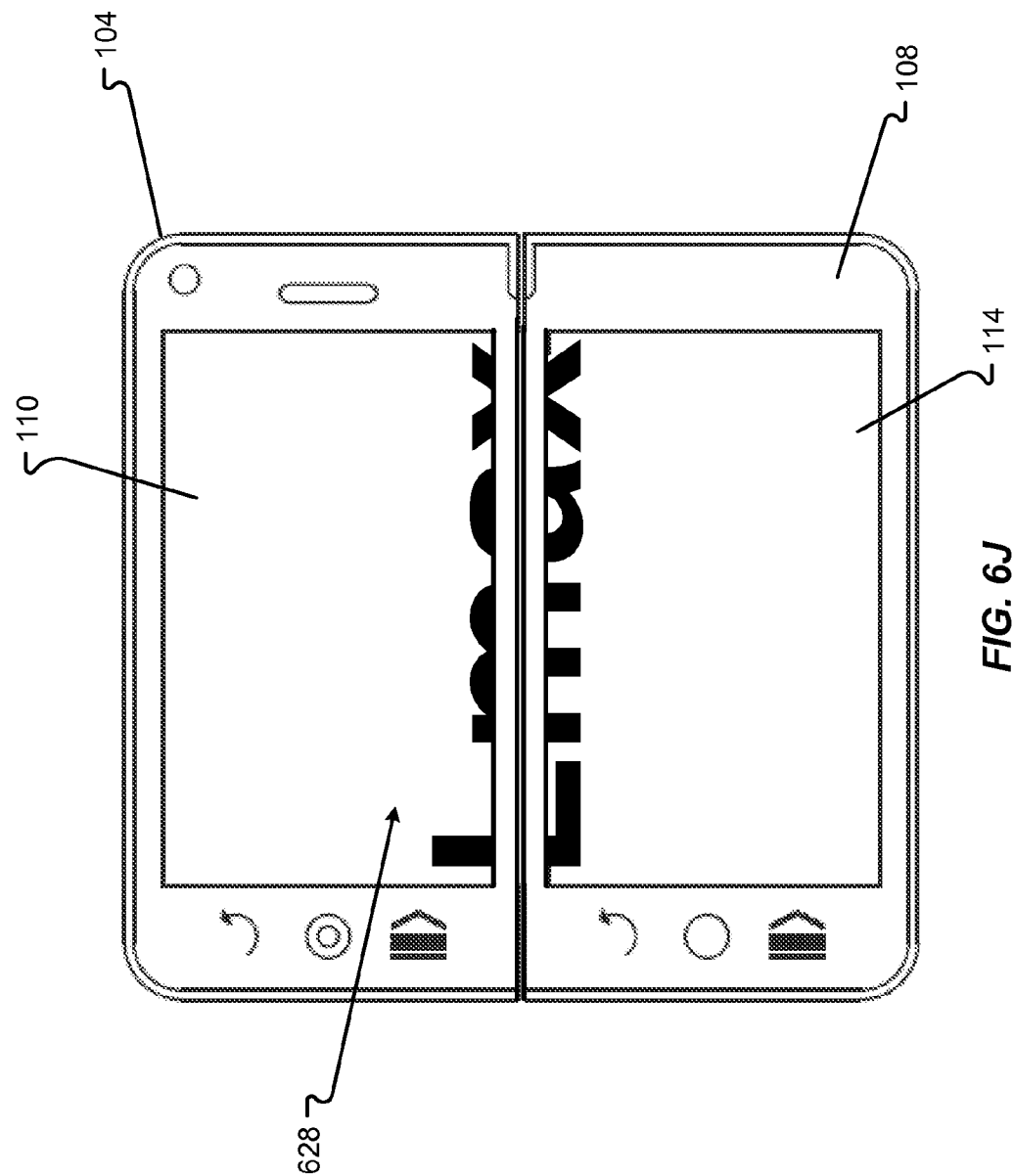
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

The device 100 may further prevent windows, application, and/or images from spilling over or spilling onto a next display when a window, application, and/or image is moved out of view or is resized. In general, a user may want to reposition a current window or image on display 110 or display 114 in order to view another window or image, or to view a portion of another window that may be blocked from view by the current window. However, it may be undesirable to reposition the current window in a manner where the current window spills across or spills onto another display during repositioning. In such an instance, if a portion of the current repositioned window spilled onto the other display, the spilled portion of the current repositioned window may block other windows and prevent a user from viewing the blocked window or application. Therefore, if a user repositions a current window such that the current repositioned window, or a portion of the current repositioned window, would normally exceed the display area of a display, that portion of the current repositioned window that exceeds the display area of the display may be clipped and not displayed.

FIGS. 7A-7G illustrate the repositioning of window 710. Initially, as shown in FIG. 7A, window 710 is entirely displayed within display 110 of screen 104 and the entire word "Window" is displayed. As window 710 is repositioned or as window 710 is repositioned toward display 114, for example in FIG. 7B, a portion 714 of window 710 is clipped, or not displayed in either display 110 or display 114. As depicted, the letter "w" from the word "Window" along with the rest of the clipped portion 714 of window 710 are not displayed on either display 110 or display 114. Only the portion of window 710 that is not clipped, i.e. 712, is displayed in display 110. FIGS. 7D-7G further illustrate a clipped portion 714 and a normally displayed portion 712, comprising window 710—as window 710 is repositioned toward display 114. In FIGS. 7D and 7E the letters "dow" and a portion of the letter "n", along with the rest of the clipped portion 714 of window 710, are not displayed in display 110 or display 114, while portion 712 of window 710 is displayed in display 110. Finally, in FIG. 7F and FIG. 7G, the letters "indow" and a portion of the letter "W", along with the rest of clipped portion 714 of window 710, are not displayed in display 110 or display 114. Only portion 712 not having been clipped is displayed in display 110.

Further, clipped portion 710 may vary depending on an amount or size of window 710 that is to be displayed on a display 110 or display 114 in relation to a clipped portion 714. For example, in FIG. 7B and FIG. 7C, the portion 712 of window 710 that is displayed within display 110 is greater than the clipped portion 714 of window 710 that is not displayed. In FIG. 7F and FIG. 7G, the portion 714 of window 710 that is clipped is greater than, or encompasses more area than, the non-clipped portion 712 of window 710. In some instances, when the clipped portion exceeds a threshold, the clipped portion 714 and the non-clipped portion 712 swap, that is, the clipped portion 714 becomes the displayed portion 712 and the displayed portion 712 becomes the clipped portion 714. This swapping of the clipped and display portion is further shown in FIGS. 7H and 7I.

FIGS. 7H and 7I illustrate a configuration where a displayed portion 712 of window 710 has been swapped with a clipped portion 714 of window 710. Specifically, the displayed portion 712 of window 710 is now displayed on display 114.

Alternatively, or in addition to, during the positioning process the portion 714 of window 710 may be clipped prior to being displayed entirely when a window is repositioned from one display 110 to another display 114. For example, and depending on user settings and preferences, if a displayed portion 712 of window 710 is displayed on display 110 while a clipped portion 714 of window 710 exceeds a threshold, the entire window 710 may be positioned such that the entire window 710 is displayed on display 114. Such an indication may be desirable when a user is attempting to move one window to another display but would like to view the entirety of the moved window. Similarly, when moving a window 710 from display 110 to display 114 using one or more of the gestures described above, as the window moves from display 110 to display 114, the moving window may at first appear to be clipped, such as shown in FIG. 7F. Once a substantial portion of the window, or when the clipped portion of the window exceeds a threshold, the entire window may appear on display 114.

Further, and in conjunction with at least some embodiments of the present disclosure, a user may desire to enlarge a window 710 or perform a zoom function such that the dimensions of window 710 exceed the display area of display 110. In some instances, it may be desirable to allow the enlarged portion that exceeds the display area of display 110 to spill over or onto display 114. In other instances, allowing the enlarged portion to spill over or onto display 114 may not be desirable. For example, an enlarged portion may block or interfere with the display of other windows or information on display 114. Therefore, if a user enlarges a current window or image such that the current enlarged window, or a portion of the current enlarged window, exceeds the display area of a display, that portion of the current enlarged window that exceeds the display area may be clipped and not displayed.

Figure 7J:
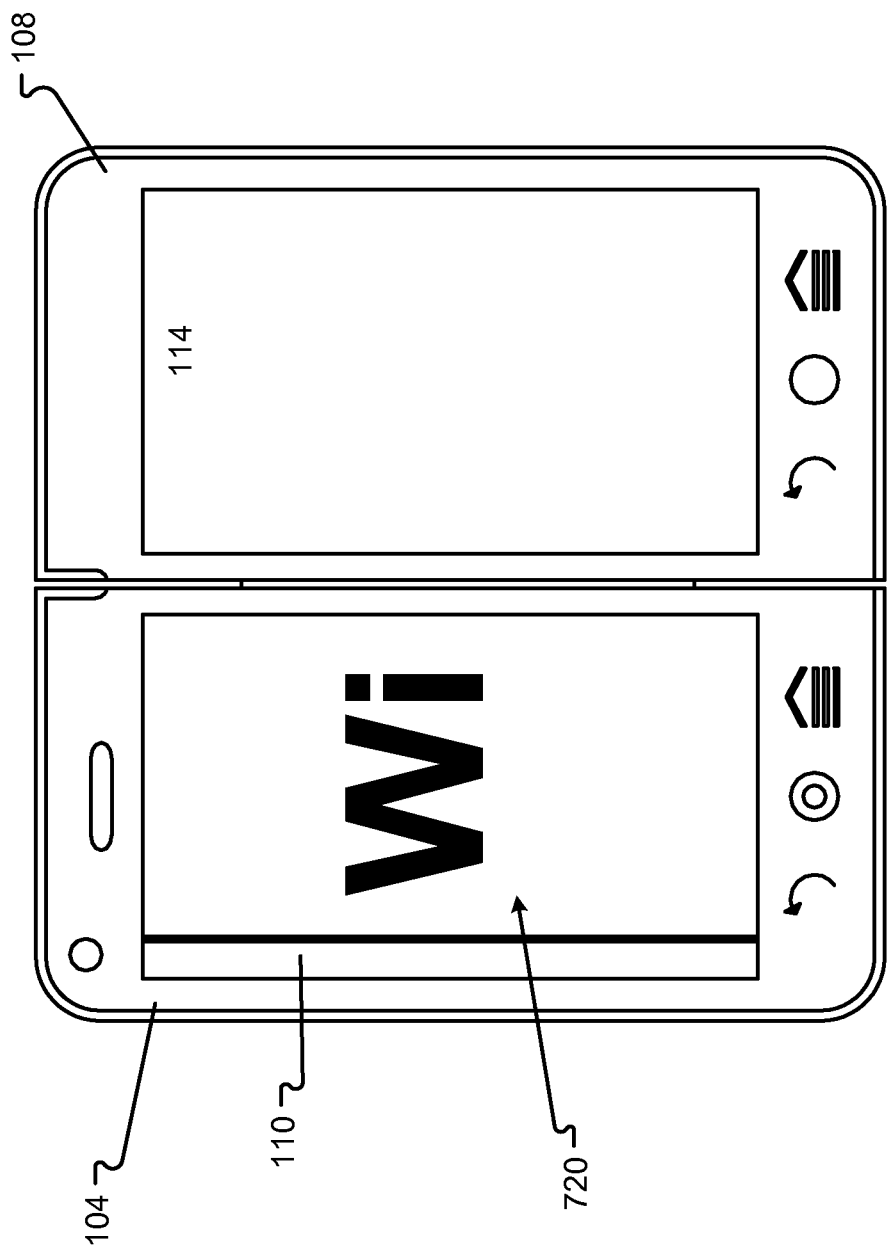

This can be further seen in FIG. 7J, where window 720 has been enlarged. The letters "Wi" are the only letters displayed on display 110 following the enlarging of the window. Note, the enlarged portion of window 720 does not spill over or onto display 114; that is, the enlarged portion of window 720 is clipped, preventing the display of window 720 on display 114.

Figure 8A:
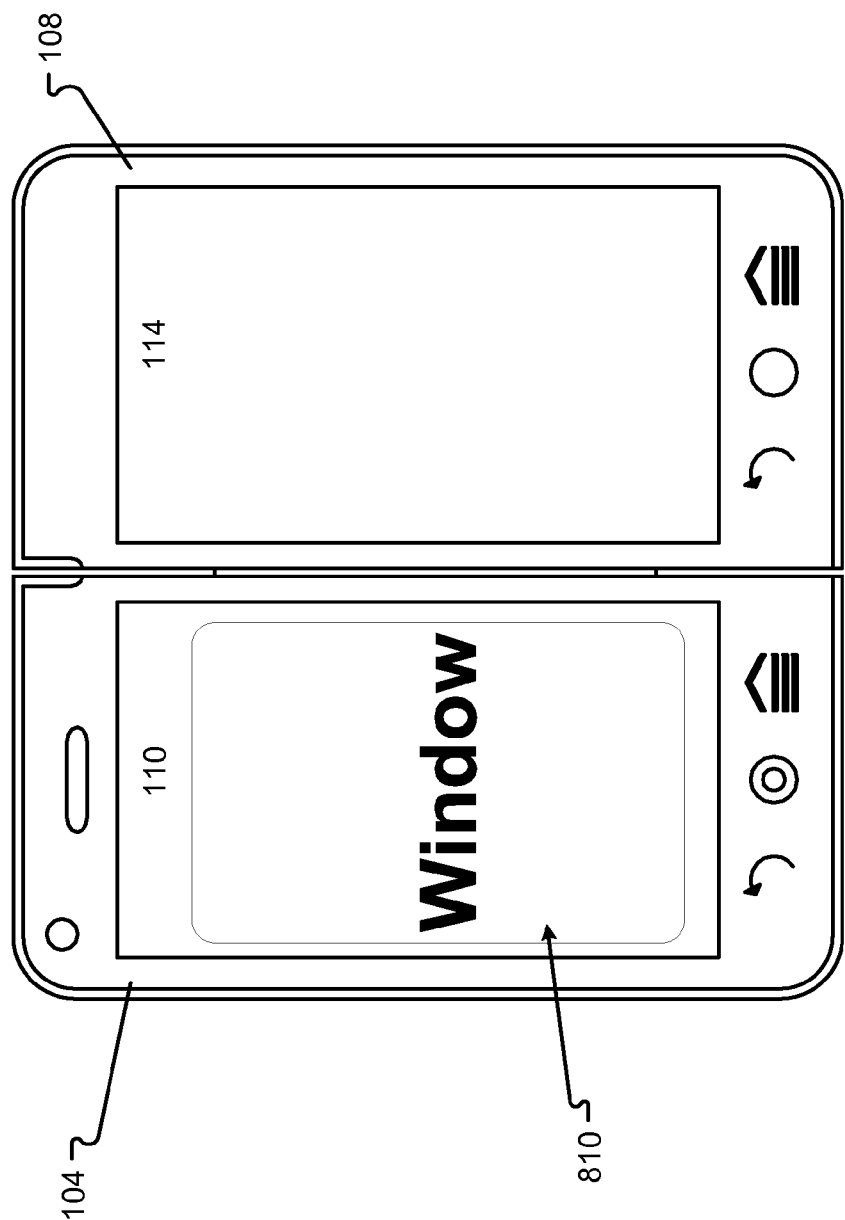
FIGS. 8A-8F are a representation of a second embodiment showing a first display and a second display in which a window is clipped.
Figure 8B:
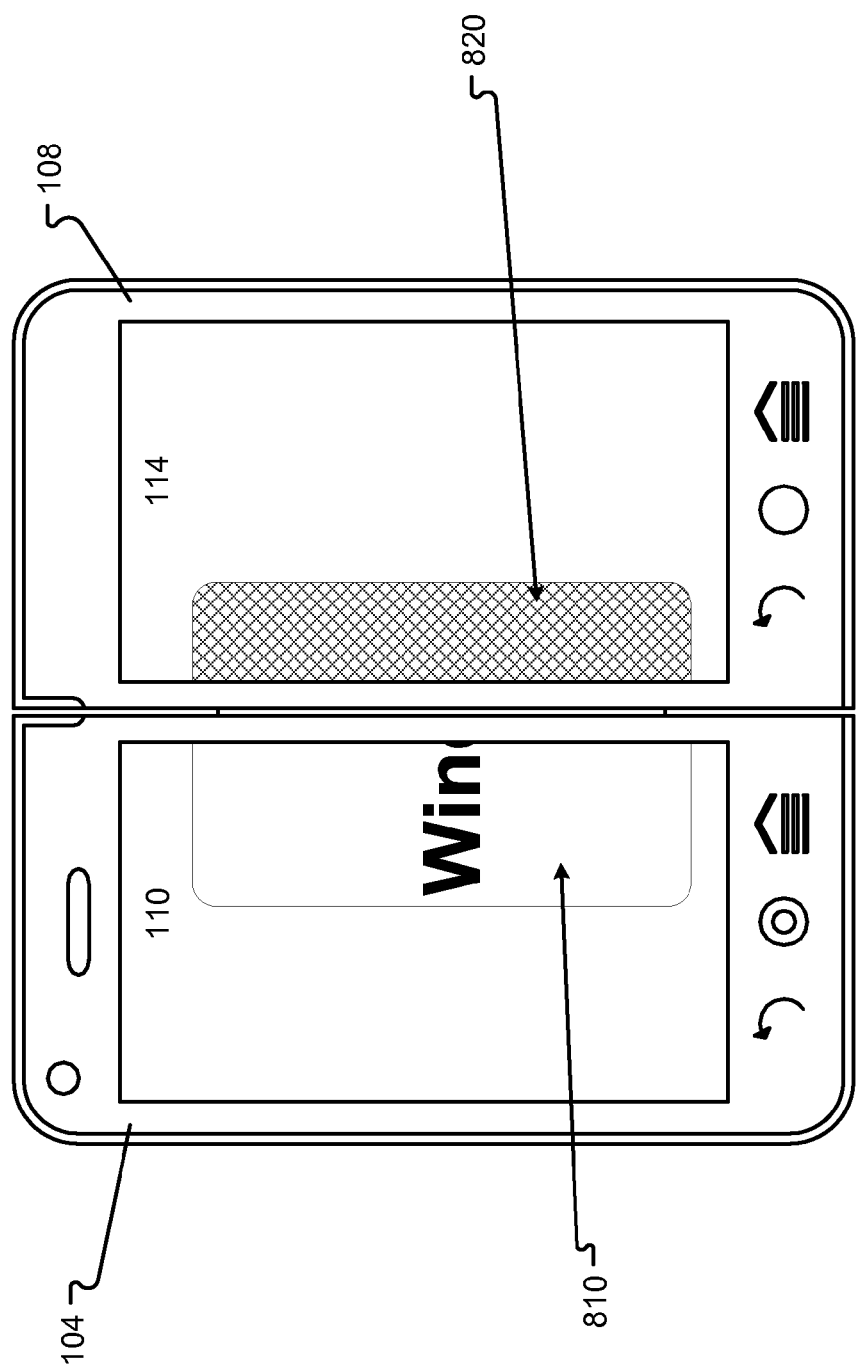
Figure 8C:
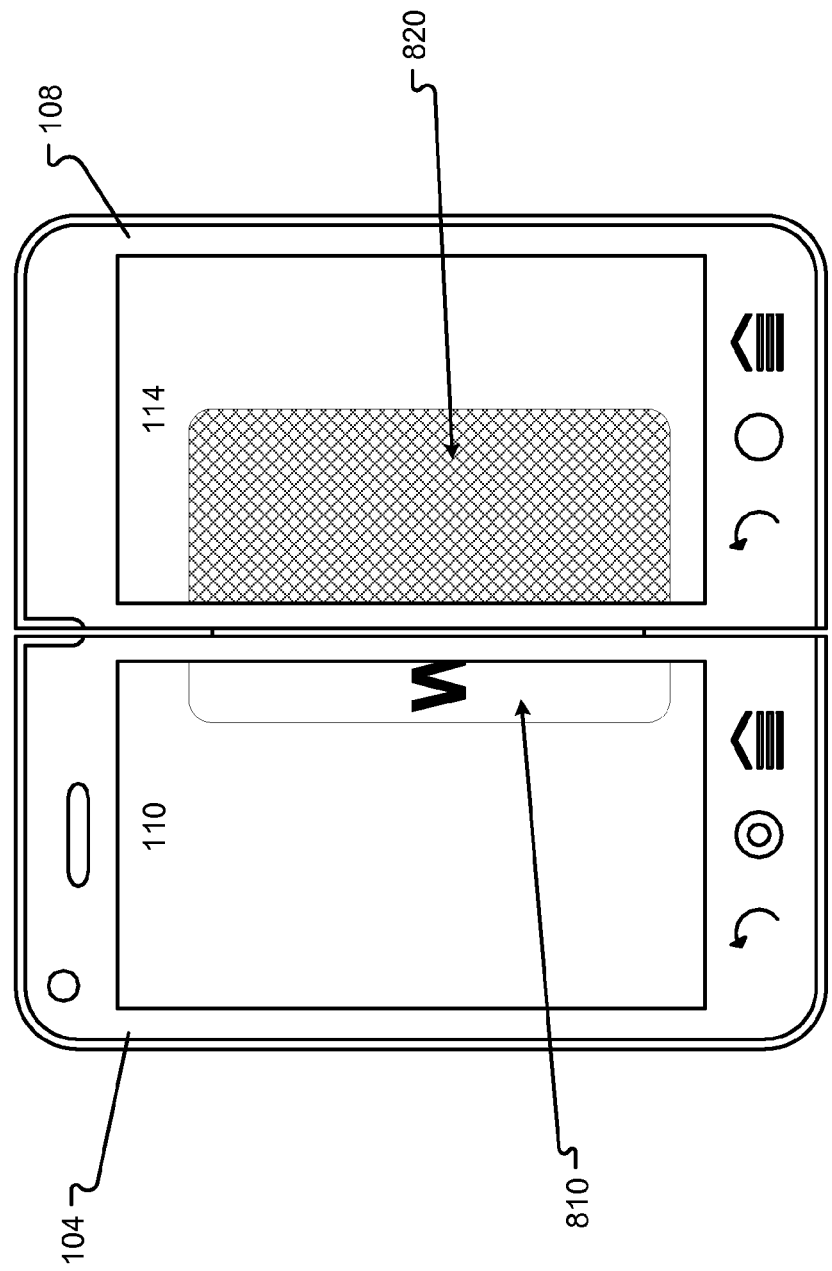

The clipping process may provide a representation to a user as to the portion of a window that is to be clipped. For example, as shown in FIG. 8A, a window 810 is entirely displayed within display 110 of screen 104 and the entire word "Window" is displayed. As window 810 is repositioned toward display 114, for example in FIG. 8B, a portion of window 810 is clipped, or not displayed in either display 110 or display 114. As depicted, the letters "dow" from the word "Window" along with the rest of the clipped portion of window 810 are not displayed on either display 110 or display 114. Only the portion of window 810 that is not clipped is displayed in display 110. Additionally, a portion or representation 820 of window 810 is displayed instead of the clipped portion. Such displayed portion or representation 820 may be a solid color portion, translucent portion, or any other color/shaped/pattern/indication that provides an indication to a user of a portion 820 of window 810 that is to be clipped. An additional example can be seen in FIG. 8C, where the letters "indow" from the word "Window" along with the rest of the clipped portion of window 810 are not displayed. Instead, an indication or a representation of the portion 820 of window 810 that is to be clipped is displayed.

Figure 8D:
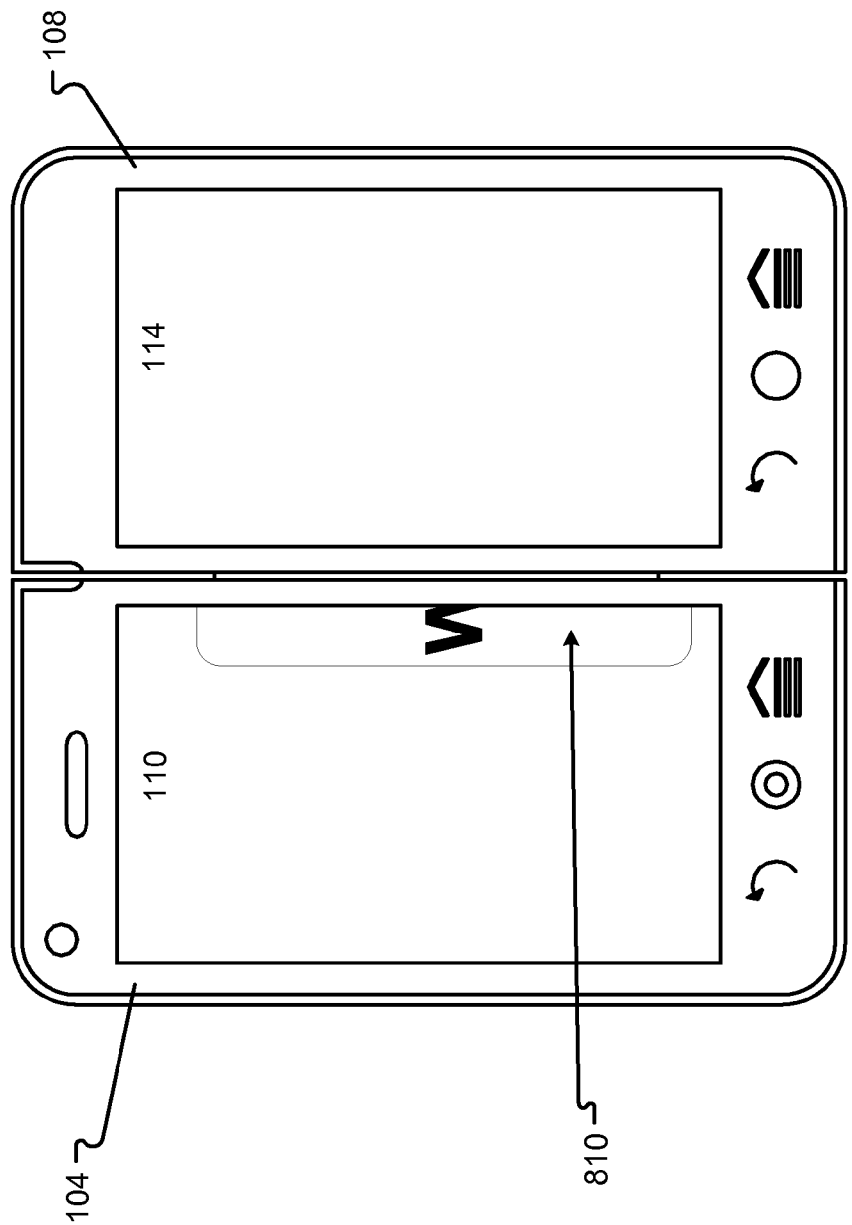

Such displayed information may be provided while a window is actively being repositioned or resized. For instance, after the window 810 has been repositioned, the area indicated as clipped 820, is no longer displayed on display 114, as shown in FIG. 8D. Alternatively, a user preference setting and/or preference may determine whether the indication or representation 820 indicating the clipped portion is to be displayed and if so, for how long.

Figure 8E:
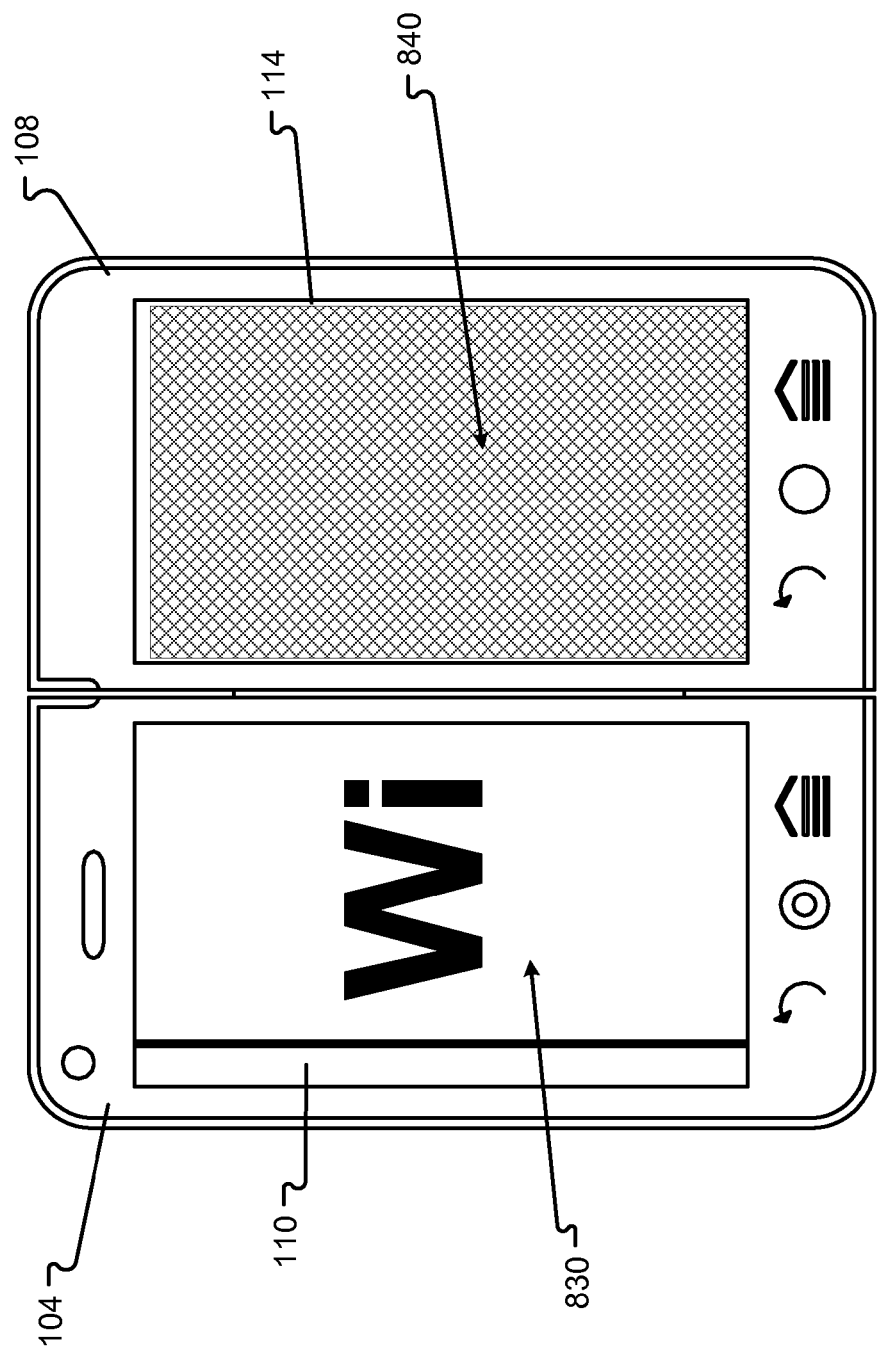
Figure 8F:
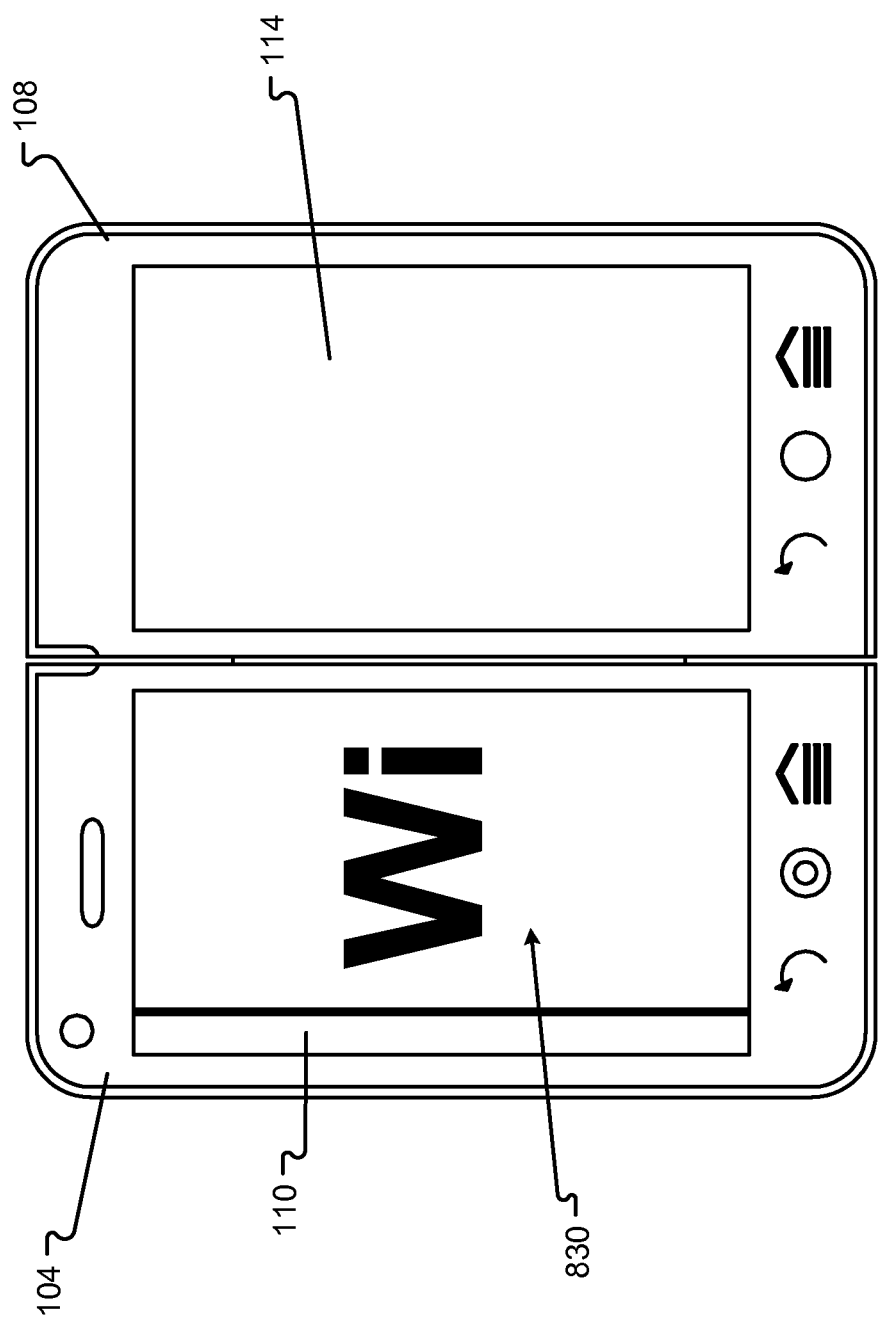

Similar to FIG. 7, a user may desire to enlarge a window 810 such that the dimensions of window 810 exceed the display area of display 110. Upon enlarging an image, window, or application, or upon zooming in on an image, window, or application, a user may be provided with an indication or representation as to a portion of window 810 that is to be clipped, as can be further seen in FIG. 8E. Once the window has been positioned and is no longer being actively enlarged or reduced, the indication or representation indicating a portion to be clipped is no longer displayed on display 114 in accordance with user settings and preferences.

With reference to FIGS. 7A-J and 8A-F, the description above provides examples of the window to be displayed i.e. 710 or 830, initially moving from display 110 to display 114. It is to be understood that the window to be displayed may initially be displayed on display 114 and move to display 110. In operating in this manner, the features described above would equally apply in such a situation. For example, as a window and/or application moves from display 114 to display 110, a portion of the window which spills over or onto display 110 would be clipped.

Referring to FIGS. 7K-L, in some embodiments of the present disclosure, the clipped portion 724 of window 710 may appear to be logically placed below the active window in the windows stack or below an active window and/or application displayed in the display. In such a configuration, the clipped portion 724 appears to be below an active window and/or application. For example, in FIG. 7L, window 710 is partially displayed on display 110 and display 114. However, a portion of window 710 displayed on display 114 is clipped such that window 710 appears logically below window 760 and window 770. As shown in FIG. 7L, the clipped portions of window 710 are two portions 724. In such a configuration, window 710 is actually clipped, even though it may appear to a user that it is logically below window 760 and window 770. Additionally, there may be a user setting or parameter that specifies a "clipping" layer such that window 710 may appear to be above some windows or applications but below others.

Further yet, window 710 may be logically placed below the active window in the windows stack or below an active window and/or application displayed on the display. In such a configuration, the window 710 appears below an active window and/or application. For example, in FIG. 7L, window 710 is partially displayed on display 110 and display 114. However, a portion of window 710 displayed on display 114 is logically placed below window 760 and window 770. Additionally, there may be a user setting or parameter that specifies a "clipping" layer such that window 710 may be placed above some windows or applications but below others.

Although any display configuration may used in accordance with embodiments of the present disclosure, the clipping of one window such that it is not displayed in another display, or such that it is prevented from spilling from one display to another display, is especially applicable to a display configuration where two or more displays are capable of simultaneous presentation. Further, clipping is especially applicable when configured in a bilateral mode—where two or more displays are active to display different windows, and also when device 100 is configured to present a single continuous image across both touch sensitive displays 110 and 114. Example display configurations may include but are not limited to a Dual-Portrait output configuration, a Dual-Landscape output configuration, a Portrait-Max configuration, and a Landscape-Max configuration. Additionally, it is noted that with reference to FIGS. 7-11, image, window, and application are used interchangeably to denote a content of a defined shape, size, or area.

Figure 9:
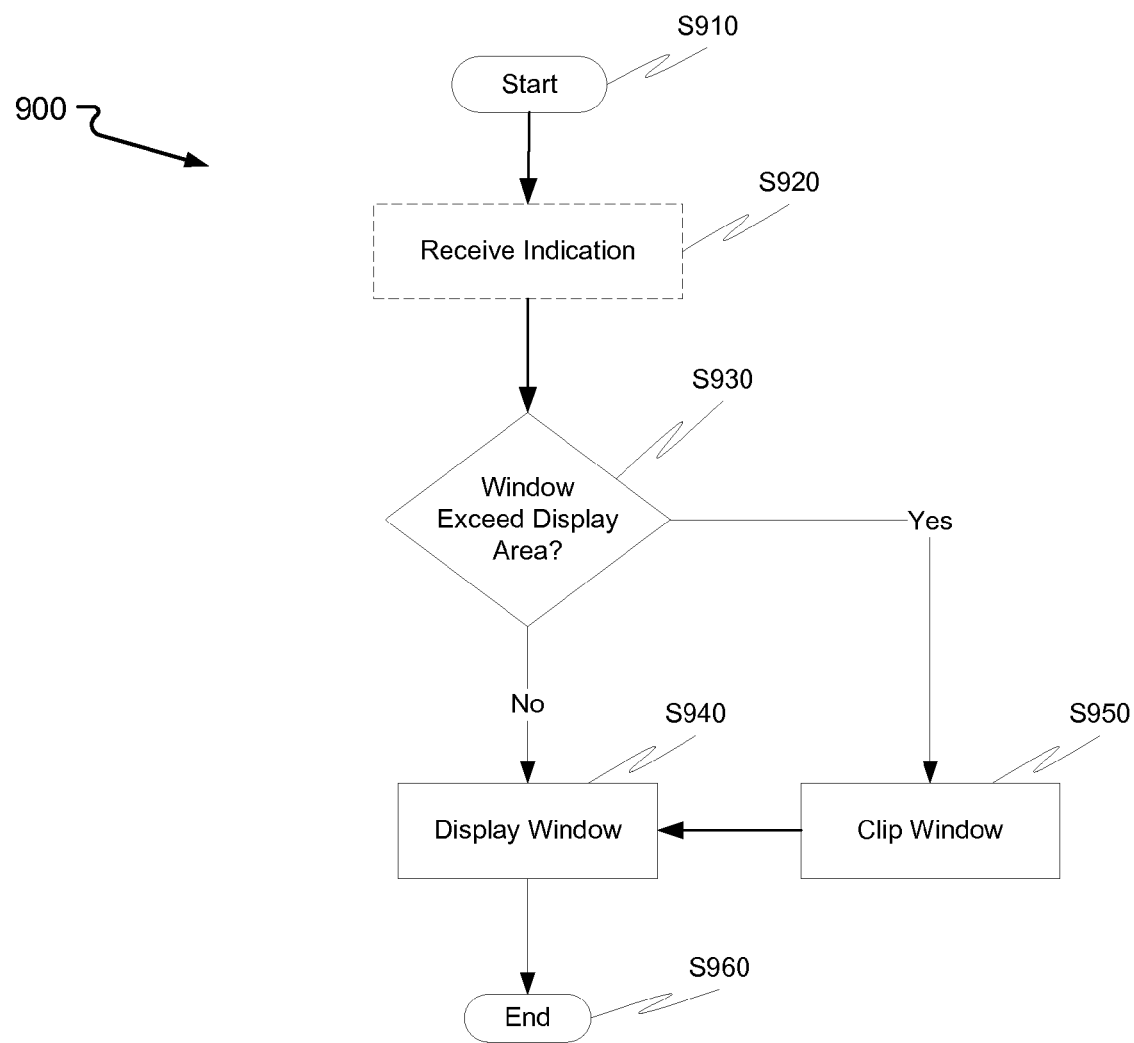
FIG. 9 illustrates a flow chart of an embodiment for clipping a portion of an image or window that is not displayed on a second display.

FIG. 9 provides an exemplary flow diagram 900 in accordance with at least some embodiments of the present disclosure. Flow 900 is in embodiments performed by a device, such as device 100. More specifically, one or more hardware or software components may be involved in performing flow 900. In one embodiment, modules in middleware 520 (FIG. 5A) such as multi-display management class 524 (FIG. 5B) perform one or more of the steps of flow 900. In other embodiments, in addition to, or in lieu of, middleware 520 performing steps of flow 900, operating system kernel(s) 516*a*, processor 504, and/or drivers 512*a*-512*b* may also perform steps of flow 900. The flow 900 can be executed as a set of computer-executable instructions executed by a computer system and encoded or stored on a computer readable medium. Hereinafter, the flow 900 shall be explained with reference to the systems, components, modules, software, data structures, user interfaces, etc. described in conjunction with FIGS. 1-8F.

Flow 900 is initiated at S910. S910 may start with a window and/or application already having been displayed in a display, such as display 110 or display 114. Method 900 may continuously flow in a loop, flow according to a timed event, or flow according to a change in an operating or status parameter. Once method 900 has started, an indication may be received at optional step S920. Such an indication may coincide with a window changing in position and/or size. Further, indication S920 may be related to a gesture indication received by a gesture capture region. Such a gesture may include a drag gesture 400, other gestures as described in FIG. 4, or may include a gesture specifically designated for initiating flow 900.

From S910 or optional step S920, flow passes to S930, where it is determined whether the window or application displayed in a display, such as display 110 of screen 104, exceeds the available area for display. For instance, display 110 may be configured to display windows, images, and/or applications at a specified resolution, dpi, and/or size. Depending on how a user or program interacts with the displayed window, image, or application, the position or size of the window may change. For example, if a user desires to position a currently displayed window (e.g. FIG. 7A) such that the entire contents of the window cannot be displayed entirely within display 110, the window will have been determined to exceed the display area (e.g. FIG. 7B). If it is determined that the window has exceeded the display area, the portion of the window that is not within the display area is then clipped (S950). Otherwise, if it is determined that the window has not exceeded the display area of the display, such as display 114, the window is displayed (S940). The flow then ends at S960.

Determining whether a window or application displayed in a display, such as display 110, exceeds the available area for display, such as in S930, may be accomplished in a variety of different ways. For example, device 100 may determine whether a window, such as window 710, exceeds a predefined perimeter of display 110. Alternatively, or in addition, device 110 may determine whether a window crosses a predefined threshold, such as an imaginary threshold between display 110 and display 114. Device 100 may also use an area calculation coupled with a location to determine whether or not a window exceeds a display area. Other methods for determining whether a window exceeds a display area may also be used in addition to or lieu of the methods herein described.

Figure 10:
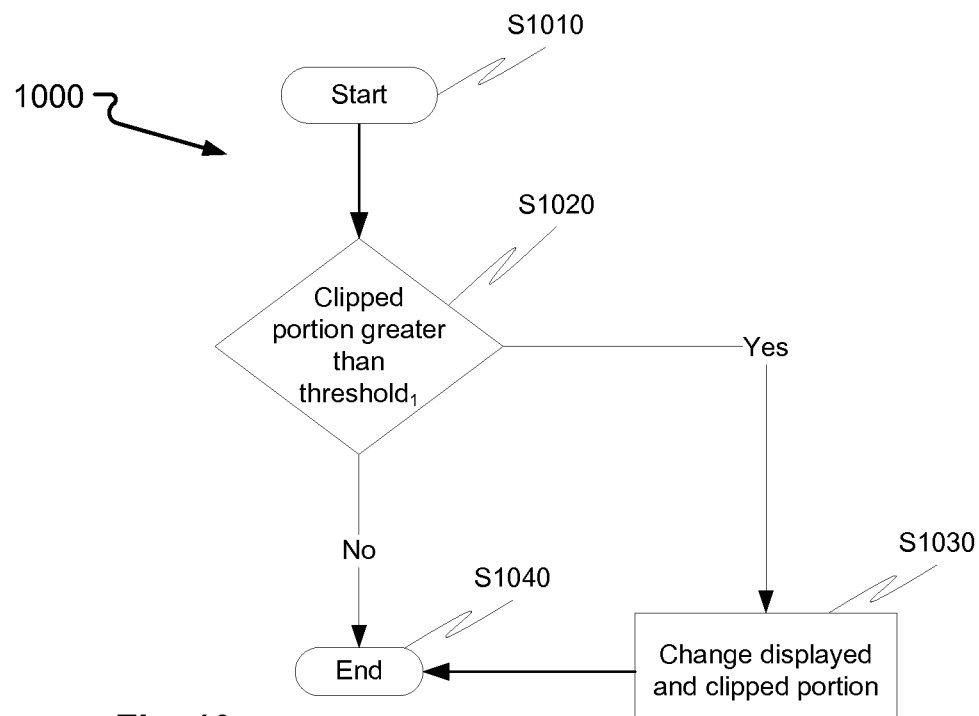
FIG. 10 illustrates a second flow chart of an embodiment for clipping a portion of an image or window that is not displayed on a second display.

FIG. 10 provides an exemplary flow diagram 1000 in accordance with at least some embodiments of the present disclosure. Flow 1000 is in embodiments performed by a device, such as device 100. More specifically, one or more hardware or software components may be involved in performing flow 1000. In one embodiment, modules in middleware 520 (FIG. 5A) such as multi-display management class 524 (FIG. 5B) perform one or more of the steps of flow 1000. In other embodiments, in addition to, or in lieu of, middleware 520 performing steps of flow 1000, operating system kernel(s) 516*a*, processor 504, and/or drivers 512*a*-512*b* may also perform steps of flow 1000. The flow 1000 can be executed as a set of computer-executable instructions executed by a computer system and encoded or stored on a computer readable medium. Hereinafter, the flow 1000 shall be explained with reference to the systems, components, modules, software, data structures, user interfaces, etc. described in conjunction with FIGS. 1-8F.

Flow 1000 is initiated at S1010. S1010 may start with a window and/or application already having been displayed in a display, such as display 110 or display 114, or flow 1000 may start following step S950 in FIG. 9. Flow 1000 may continuously flow in a loop, flow according to a timed event, or flow according to a change in an operating or status parameter. Once method 1000 has started, device 100 determines whether a clipped portion is greater than a particular threshold, for example Threshold$_1$. Such a determination may be made by, but not limited to, comparing the overall area of a clipped portion, the perimeter of a clipped portion, and/or the location and size of a clipped portion. Further, Threshold$_1$ may be a parameter, setting, or variable set by a user. Alternatively, or in addition to, Threshold$_1$ may be derived, for example, Threshold1 may be the size, area, perimeter, location etc. . . . of a non-clipped portion or displayed portion (i.e. 712) of a window or application. If device 100 determines that the clipped portion of a window or application is greater than a threshold, flow moves to S1030. At step S1030, the displayed portion and the clipped portion change. For example, the previously displayed portion of a window becomes the clipped portion and the previously clipped portion of a window becomes the displayed portion. Further, if the previously displayed portion was displayed in display 110 while the previously clipped portion was prevented from being displayed in display 114, display 114 may now display the displayed portion while display 110 may be prevented from displaying the clipped portion. Flow 1000 then ends at step S1040. It should be noted that although a clipped portion is compared against a threshold, the non-clipped portion may be used instead of or in addition to the clipped portion and may be compared to a threshold.

Figure 11:
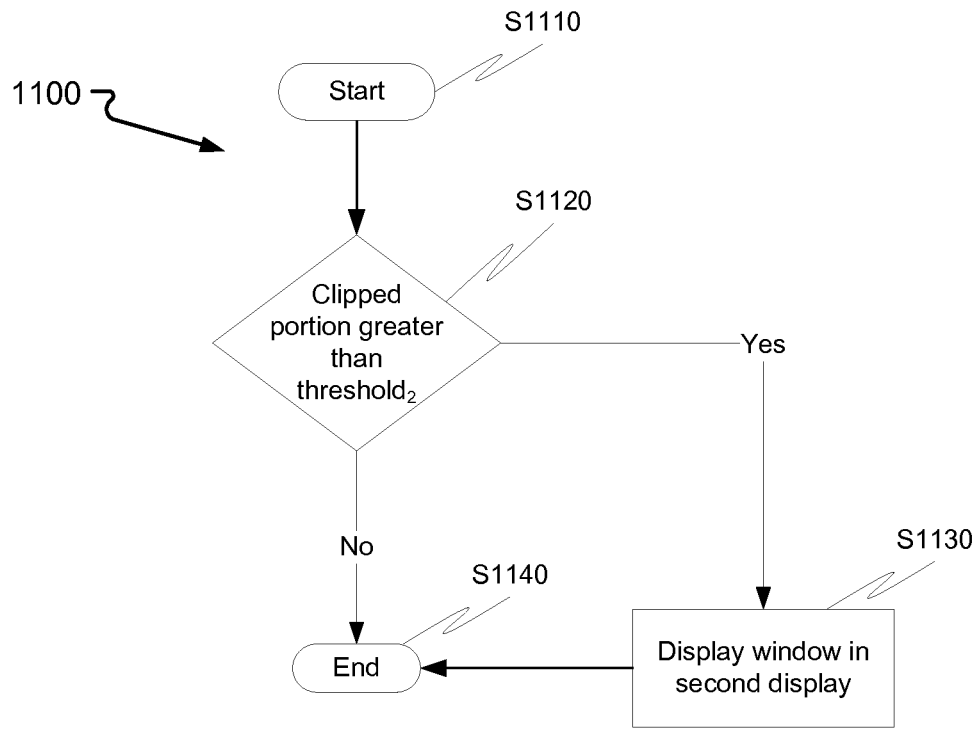
FIG. 11 illustrates a third flow chart of an embodiment for clipping a portion of an image or window that is not displayed on a second display.

FIG. 11 provides an exemplary flow diagram 1100 in accordance with at least some embodiments of the present disclosure. Flow 1100 is in embodiments performed by a device, such as device 100. More specifically, one or more hardware or software components may be involved in performing flow 1100. In one embodiment, modules in middleware 520 (FIG. 5A) such as multi-display management class 524 (FIG. 5B) perform one or more of the steps of flow 1100. In other embodiments, in addition to, or in lieu of, middleware 520 performing steps of flow 1100, operating system kernel(s) 516*a*, processor 504, and/or drivers 512*a*-512*b* may also perform steps of flow 1100. The flow 1100 can be executed as a set of computer-executable instructions executed by a computer system and encoded or stored on a computer readable medium. Hereinafter, the flow 1100 shall be explained with reference to the systems, components, modules, software, data structures, user interfaces, etc. described in conjunction with FIGS. 1-8F.

Flow 1100 is initiated at S1110. S1110 may start with a window and/or application already having been displayed on a display, such as display 110 or display 114, or flow 1100 may start following step S950 in FIG. 9. Flow 1100 may continuously flow in a loop, flow according to a timed event, or flow according to a change in an operating or status parameter. Once method 1100 has started, device 100 determines whether a clipped portion is greater than a particular threshold, for example $Threshold_2$. Such a determination may be made by, but not limited to, comparing the overall area of a clipped portion, the perimeter of a clipped portion, and/or the location and size of a clipped portion. Further, $Threshold_2$ may be a parameter, setting, or variable set by a user. Alternatively, or in addition to, $Threshold_2$ may be derived, for example, Threshold2 may be the size, area, perimeter, location etc. . . . of a non-clipped portion or displayed portion (i.e. 712) of a window or application. If device 100 determines that the clipped portion of a window or application is greater than a threshold, flow moves to S1130. At step S1130, the entire window may be displayed in a second display. Flow 1100 may used in instances where a user wishes to drag a window or application from one display, for example display 110, to another display, for example display 114. In executing flow 1100, when being moved or resized, the window may initially be clipped until the clipped portion exceeds a certain threshold. Once the clipped portion has exceeded a threshold, for example $Threshold_2$, the entire window or application is then displayed within the display area of the second display, such as display 114 and the flow 1100 ends at S1140. If the clipped portion has not exceeded a threshold, the flow 1100 ends at S1140. It should be noted that although a clipped portion is compared against a threshold, the non-clipped portion may be used instead of or in addition to the clipped portion and may be compared to a threshold.

Advantages of clipping a portion of a window may be many. For example, when working in a dual-screen environment where a user wishes to reposition an image, window or application, a portion of the repositioned image, window or application may not be rendered, saving cpu cycle, processing time and battery life. Additionally, depending on the positioning of such a window or the position of all the windows displayed, an increased amount of information may be conveyed to a user.

The exemplary systems and methods of this disclosure have been described in relation to preventing a portion of a window or application from spilling over or onto another display. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as device 100, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configurations, and methods.

A number of variations and modifications of the disclosure can be used. It would be possible to provide for some features of the disclosure without providing others.

For example in one alternative embodiment, a positional indication representing the position of a clipped portion of a window, application or image is displayed on a display 110 or 114.

In another alternative embodiment, a gesture is received by device 100. The received gesture may provide an indication to device 100 that a user desires a window, application or image to be clipped.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method, comprising:
providing a device having at least first and second screens;
displaying, by the device, an image in a first display of the first screen, wherein the image is displayed entirely within a display area of the first display;
determining that the image displayed in the first display of the first screen requires clipping as a result of receiving a user request to move or resize the image;
clipping the image displayed in the first display of the first screen such that a first portion of the image is displayed in the first display of the first screen and a second portion of the image, which is being clipped, is prevented from being displayed in the first display of the first screen and a first display of the second screen; and
displaying, by the device, in the first display of the second screen, and in place of the clipped portion, a translucent representation of the clipped portion of the image, the representation being a size and shape of the clipped portion.

2. The method of claim 1, wherein the first portion of the image is a non-clipped portion and the second portion of the image is a clipped portion.

3. The method of claim 1, wherein the determining step further comprises:
determining if the image displayed in the first display of the first screen exceeds a displayable area of the first display of the first screen.

4. The method of claim 3, wherein the determining step is performed in response to detecting a change in the image displayed in the first display of the first screen.

5. The method of claim 4, wherein the change that is detected at least one of a movement of the image and a resizing of the image.

6. The method of claim 1, further comprising:
wherein a positional indication representing the second portion of the image is displayed in the first display of the second screen.

7. The method of claim 6, further comprising:
wherein the positional indication is a translucent representation of the second portion of the image.

8. The method of claim 1, further comprising:
determining that a displayable area of the first portion of the image displayed in the first display is less than or equal to a displayable area of the second portion of the image;
preventing the display of the first portion of the image in the first display of the first screen while displaying the second portion of the image in the first display of the second screen;
wherein the second portion of the image can be entirely displayed within a display area of the second display.

9. The method of claim 1, further comprising:
wherein displaying the first portion of the image in the first display of the first screen and not displaying the second portion of the image in a first display of the second screen is performed in response to receiving an indication from a user.

10. The method of claim 9, further comprising:
wherein the indication received from the user further comprises a drag operation.

11. A non-transitory computer readable medium storing computer executable instructions that when executed by at least one processor perform a method comprising:
displaying an image in a first display of a first screen;
determining that the image displayed in the first display of the first screen requires clipping as a result of receiving a user request to move or resize the image;
clipping the image displayed in the first display of the first screen such that a first portion of the image is displayed in the first display of the first screen and a second portion of the image, which is being clipped, is prevented from being displayed in the first display of the first screen and in a first display of a second screen; and
displaying, in the first display of the second screen, and in place of the clipped portion, a translucent representation of the clipped portion of the image, the representation being a size and shape of the clipped portion.

12. The non-transitory computer readable medium of claim 11, wherein the first portion of the image is a non-clipped portion and the second portion of the image is a clipped portion.

13. The non-transitory computer readable medium of claim 11, wherein the determining step further comprises:
determining if the image displayed in the first display of the first screen exceeds a displayable area of the first display of the first screen.

14. The non-transitory computer readable medium of claim 13, wherein the determining step is performed in response to detecting a change in the image displayed in the first display of the first screen.

15. The non-transitory computer readable medium of claim 14, wherein the change that is detected is at least one of a movement of the image and a resizing of the image.

16. A multiscreen communication device, comprising:
a first display of a first screen;
a second display of a second screen;
a computer readable medium that stores computer executable instructions that when executed by at least one processor perform a method comprising:
displaying an image in a first display of the first screen;
determining that the image displayed in the first display of the first screen requires clipping as a result of receiving a user request to move or resize the image;
clipping the image displayed in the first display of the first screen such that a first portion of the image is displayed in the first display of the first screen and a second portion of the image is prevented from being displayed in the first display of the first screen and in a first display of the second screen; and
displaying, in the first display of the second screen, and in place of the clipped portion, a translucent representation of the clipped portion of the image, the representation being a size and shape of the clipped portion.

17. The device of claim 16, wherein the first portion of the image is a non-clipped portion and the second portion of the image is a clipped portion.

18. The device of claim 17, wherein the determining step further comprises:
determining if the image displayed in the first display of the first screen exceeds a displayable area of the first display of the first screen.

19. The device of claim 17, wherein the determining step is performed in response to detecting a change in the image displayed in the first display of the first screen.

20. The device of claim 19, wherein the change that is detected is at least one of a movement of the image and a resizing of the image.

* * * * *